(12) United States Patent
Kodama et al.

(10) Patent No.: US 7,724,989 B2
(45) Date of Patent: May 25, 2010

(54) OPTICAL/ELECTRICAL COMPOSITE WIRING BOARD AND A MANUFACTURING METHOD THEREOF

(75) Inventors: Hiroaki Kodama, Ibi-gun (JP); Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/118,344

(22) Filed: May 9, 2008

(65) Prior Publication Data
US 2008/0317402 A1    Dec. 25, 2008

Related U.S. Application Data

(63) Continuation of application No. PCT/JP2006/319781, filed on Oct. 3, 2006.

(30) Foreign Application Priority Data
Dec. 27, 2005    (JP) .............................. 2005-375878

(51) Int. Cl.
*G02B 6/10*    (2006.01)
*G02B 6/12*    (2006.01)
(52) U.S. Cl. ......................................... 385/14; 385/131
(58) Field of Classification Search .................... 385/14, 385/129–132
See application file for complete search history.

(56) References Cited

U.S. PATENT DOCUMENTS 7,070,207 B2 * 7/2006 Asai .............................. 285/14
7,149,376 B2 * 12/2006 Uchida et al. .................. 385/15
7,437,030 B2 * 10/2008 Asai et al. ...................... 385/14
2006/0012967 A1    1/2006 Asai et al.
2007/0223935 A1    9/2007 Asai et al.

FOREIGN PATENT DOCUMENTS

JP    6-167622    6/1994

(Continued)

OTHER PUBLICATIONS

U.S. Appl. No. 11/693,188, filed Mar. 29, 2007, Kodama et al.

(Continued)

*Primary Examiner*—Daniel Petkovsek
(74) *Attorney, Agent, or Firm*—Oblon, Spivak, McClelland, Maier & Neustadt, L.L.P.

(57) ABSTRACT

The optical/electrical composite wiring board comprises a lower insulating layer that also serves as a lower clad; a upper insulating layer that also serves as an upper clad; a core that is placed between the lower insulating layer and the upper insulating layer and has a predetermined optical wiring pattern; and a conductor layer that is placed along with the core between the lower insulating layer and the upper insulating layer and has a predetermined electrical wiring pattern. Herein, the core and the conductor layer are formed via a short manufacturing method, whereby the concave portion for optical wiring and the concave portion for electrical wiring are formed on the lower insulating layer by press process, and a core material and conductor material are filled into each of the concave portions, and afterward, the core material and conductor material are ground until they are flush with the upper surface of the lower insulating layer.

9 Claims, 11 Drawing Sheets

FOREIGN PATENT DOCUMENTS

| | | |
|---|---|---|
| JP | 2001-311846 A | 11/2001 |
| JP | 2002-250830 A | 9/2002 |
| JP | 2004-4428 | 1/2004 |
| JP | 2005-108924 A | 4/2005 |

OTHER PUBLICATIONS

U.S. Appl. No. 11/733,361, filed Apr. 10, 2007, Asai et al.

U.S. Appl. No. 12/112,026, filed Apr. 30, 2008, Kodame et al.

* cited by examiner (a)

(b)

(c)

(d)

(e)

OPTICAL/ELECTRICAL COMPOSITE WIRING BOARD AND A MANUFACTURING METHOD THEREOF

CROSS REFERENCE TO RELATED APPLICATIONS

This application is a continuation of PCT/JP06/319781, filed Oct. 3, 2006. This application also claims benefit of and priority to Japanese Application No. 2005-375878, filed Dec. 27, 2005. The contents of PCT/JP06/319781, JP 2005-375878 and Japanese Application No. 06-167622, filed on Nov. 30, 1992, are all hereby incorporated by reference.

FIELD OF THE INVENTION

The present invention relates to an optical/electrical composite wiring board and a manufacturing method thereof, and specifically, an optical/electrical composite wiring board in which optical wiring and electrical wiring are mixed, and a manufacturing method thereof.

DISCUSSION OF THE BACKGROUND

The signal frequency of large-scale integration (LSI) has been increasing every year. Here, electrical transmission for transmitting signals of LSI via electrical wiring involves electromagnetic interference noise, increases in wiring density, attenuation of signals due to skin effect, increases in skew, and the like. Therefore, there is a limitation in the processing and transmission of high-frequency signals only by electrical wiring for future needs. On the other hand, since optical transmission for transmitting signals by optical wiring is high-speed, low-loss, noninductive, and the like, it does not cause problems from electrical wiring.

SUMMARY OF THE INVENTION

One aspect of the invention includes an optical/electrical composite wiring board comprising a lower insulating layer serving as a lower clad of an optical waveguide; an upper insulating layer serving as an upper clad of said optical waveguide; a core of the optical waveguide between the lower insulating layer and the upper insulating layer including a predetermined optical wiring pattern; a conductor layer between the lower insulating layer and the upper insulating layer, the conductor layer comprising a predetermined electrical wiring pattern; and a concave portion formed in the lower insulating layer, the concave portion comprising at least one of a concave portion for optical wiring that is formed into substantially the same pattern as said optical wiring pattern and filled with core material, or a concave portion for electrical wiring that is formed into substantially the same pattern as said electrical wiring pattern and filled with conductor material.

Another aspect of the invention includes a method of manufacturing an optical/electrical composite wiring board that comprises forming a lower insulating layer that is configured to serve as a lower clad of an optical waveguide; forming a conductor layer and a core of the optical waveguide on the insulating member, the core having a predetermined optical wiring pattern and the conductor layer having a predetermined electrical wiring pattern in said lower insulating layer. Forming a conductor layer and a core on the insulating layer comprises laminating an upper insulating layer on the lower insulating layer to cover the core and the conductor layer, the upper insulating layer being configured to serve as an upper clad of the optical waveguide.

BRIEF DESCRIPTION OF DRAWING

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 11:
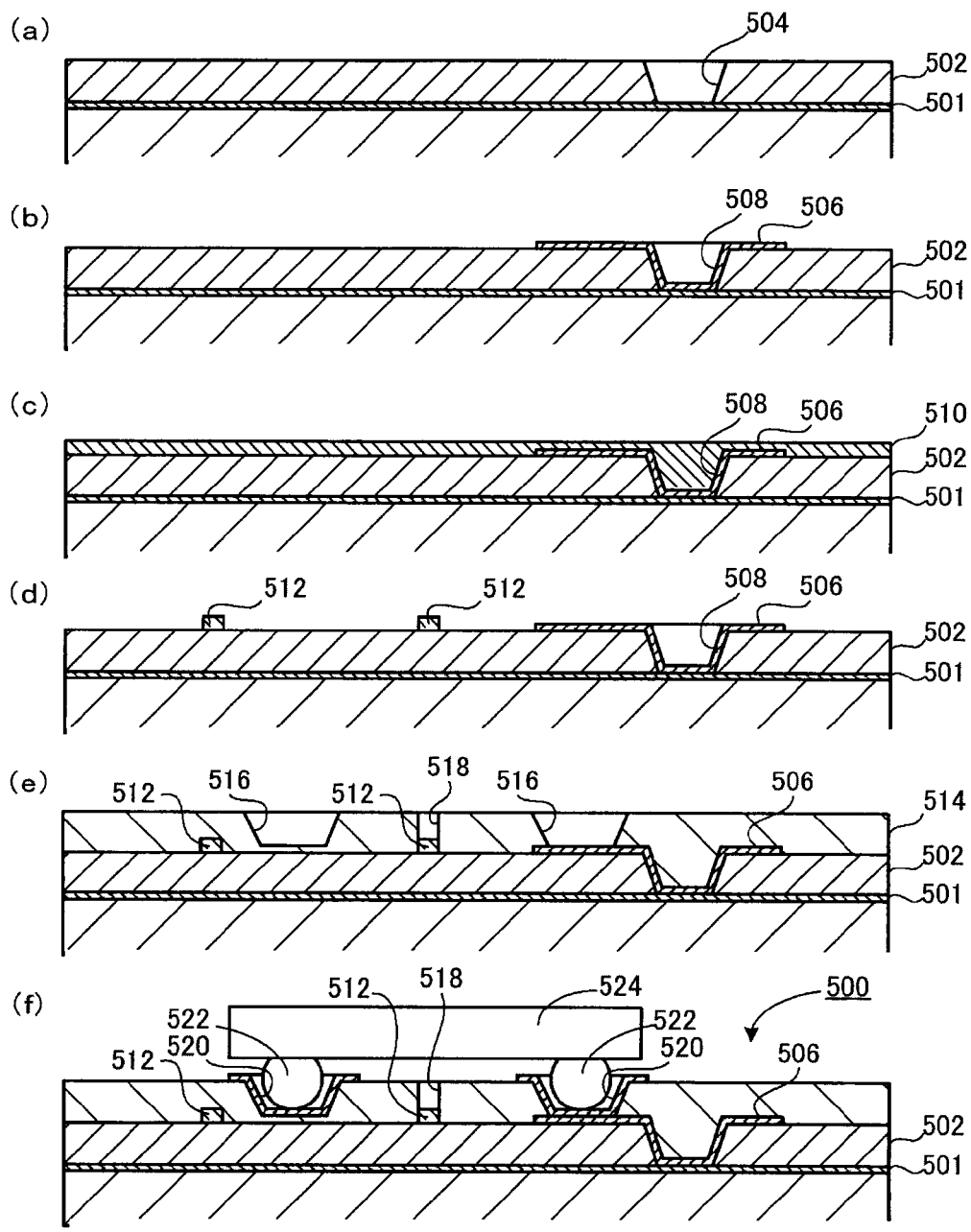
FIG. 11 is an explanatory drawing of a conventional optical/electrical composite wiring board.

As discussed in the background, in an optical/electrical composite wiring board, optical wiring and electrical wiring are mixed. An optical/electrical composite wiring board was developed to transmit using optical signals and process using electrical signals in, for example, Japanese Publication No. 06-167622, the entire contents of which are incorporated herein by reference. Referring to FIG. 11(f), Japanese Publication No. 06-167622 describes the optical/electrical composite wiring board 500 implementing the photonic device 524, wherein the core 512 that has a predetermined optical wiring pattern and the conductor layer 506 that has a predetermined electrical wiring pattern are placed on a silica glass layer 502 on the conductor layer 501. The optical/electrical composite wiring board 500 is manufactured as follows: Specifically, positive resist is used for the silica glass layer 502, the via-hole 504 is placed by RIE (reactive ion etching) (Refer to FIG. 11(a)), the conductor layer 506 is formed on the silica glass layer 502, and the via-hole conductor 508 is formed so as to cover the bottom surface and sidewall of the via-hole 504 (Refer to FIG. 11(b)). Next, the silica glass layer 510 doped with germanium dioxide and the like is laminated on the silica glass layer 502 (Refer to FIG. 11(c)), and the silica glass layer 510 is patterned by RIE and the core 512 of optical waveguide is formed (Refer to FIG. 11(d)). Next, after the silica glass layer 514 is laminated on the silica glass layer 510, in which the core 512 is formed, using a sol-gel method, the mounting part formation pore 516 and the signal pore 518 are placed on a predetermined part by RIE (Refer to FIG. 11(e)), the solder bump 522 is formed on the mounting part formation pore 516 to make the mounting part 520, and the photonic device 524 is implemented via the solder bump 522 (Refer to FIG. 11(f)).

The present invention is intended to provide an optical/electrical composite wiring board that can be manufactured easily and has a good yield rate and low cost of manufacturing. Moreover, it is also intended to provide a method suitable for manufacturing such an optical/electrical composite wiring board.

An optical/electrical composite wiring board according to an embodiment of the present invention comprises:

a lower insulating layer configured to serve as a lower clad of an optical waveguide;

an upper insulating layer configured to serve as an upper clad of said optical waveguide;

a core of said optical waveguide between said lower insulating layer and said upper insulating layer, the core including a predetermined optical wiring pattern;

a conductor layer between said lower insulating layer and said upper insulating layer, the conductor layer including a predetermined electrical wiring pattern; and a concave portion formed in said lower insulating layer, the concave portion comprising at least one of a concave portion for optical wiring that is formed into substantially the same pattern as said optical wiring pattern and filled with core material, or a concave portion for electrical wiring that is formed into substantially the same pattern as said electrical wiring pattern and filled with conductor material is formed in said lower insulating layer.

In one embodiment of the optical/electrical composite wiring board, at least one concave portion for an optical wiring or concave portion for electrical wiring is formed in the lower insulating layer. Herein, to form the core of the optical waveguide using the concave portion for optical wiring, for example, a short manufacturing process can be employed: (1) a concave portion for optical wiring that has the same pattern as the optical wiring pattern is formed in the lower insulating layer by press working, (2) core material is filled in the concave portion for optical wiring, and (3) the core material and the upper surface of the lower insulating layer are ground until they are flat. Additionally, in order to form a conductor layer using the concave portion for electrical wiring, for example, a short manufacturing process can be employed: (1) concave portion for electrical wiring that has the same pattern as the electrical wiring pattern is formed in the lower insulating layer by press working, (2) conductor material is filled in the concave portion for electrical wiring, and (3) the conductor material and the upper surface of the lower insulating layer are ground until they are flat. Therefore, according to the optical/electrical composite wiring board of the present invention, at least a core of the optical waveguide formed on the lower insulating layer or a conductor layer can be formed via a short manufacturing processing, so manufacture of the optical/electrical composite wiring board is made easier, the yield rate is improved, and manufacturing costs are lower.

Here, the lower insulating layer, the upper insulating layer, and the core may be made of any materials, as long as they have optical properties suitable for optical waveguide as well as electrical insulation, but materials with refractive index of 1.40 to 1.60 are preferable. Moreover, the core will preferably have a larger refractive index than the upper insulating layer and the lower insulating layer by 0.005 to 0.05, and more preferably 0.01 to 0.03. Furthermore, optical signals passing through the core are transmitted by being reflected by the upper clad and lower clad surrounding the core, so transmissivity of the core should preferably be at least 70%/mm, and more preferably at least 90%/mm. This can reduce optical propagation loss. Furthermore, as specific materials of the lower insulating layer, the upper insulating layer, and the core, examples of various resin materials that can be used include polymethylmethacrylate resin, acrylic resin (e.g., UV curable acrylic resin), epoxy resin (e.g., UV curable acrylic resin), polyolefin resin, silicon resin, polysiloxane resin, polyimide resin, and benzocyclobutene.

For an optical/electrical composite wiring board of the present invention, both said concave portion for optical wiring and said concave portion for electrical wiring should preferably be formed in said lower insulating layer. In this way, both the core of the optical waveguide and the conductor layer can be formed in a shorter manufacturing process than before, so the optical wiring pattern and electrical wiring pattern can be manufactured more easily, the yield rate can be improved, and the cost of manufacturing can be made much lower.

For an optical/electrical composite wiring board of the present invention, at least one part of the inner surface of said concave portion for electrical wiring should preferably be a treated surface to improve adhesion between the concave portion for electrical wiring of the lower insulating layer and the conductor layer. At this time, the surface of the conductor layer may be a treated surface so as to improve adhesion between the upper insulating layer and the conductor layer laminated on the conductor layer to improve reliability.

For an optical/electrical composite wiring board of the present invention, said core would preferably have a reflective surface with an about 45° center axis of the core on the end and said upper insulating layer forms an outermost layer. This enables the input/output of optical signals to be substantially orthogonal to the center axis of the core, so photonic devices such as VCSEL (Vertical Cavity Surface Emitting Laser) and PD (photodiode device) can be easily implemented on the upper surface of an optical/electrical composite wiring board. Additionally, the optical signals entering the core of the optical waveguide and optical signals exiting the core are inputted externally and outputted externally if they pass through only one upper insulating layer forming the upper clad, so optical propagation loss due to input/output can be reduced.

According to an optical/electrical composite wiring board of the present invention, for said lower insulating layer and said upper insulating layer, at least said lower insulating layer preferably contains scale-like particles. In order to form the concave portion for optical wiring in the lower insulating layer, resin dripping, etc., of the concave portion for optical wiring is prevented because of the presence of the scale-like particles, and formation reliability improves. Therefore, at the time of mass production, the core can be stable and formed into the same form, and no worsening of optical propagation loss caused by an instability of formation occurs. On the other hand, in order to form the concave portion for electrical wiring in the lower insulating layer, resin dripping, etc., of the concave portion for electrical wiring is prevented because of the presence of the scale-like particles, and formation reliability improves. Therefore, at the time of mass production, electrical wiring can be stable and formed into the same formation, and matching of characteristic impedance with devices to be implemented is not disrupted, so the quality of signals to be transmitted is not lowered. Additionally, if conductor layers placed on and below the lower insulating layer are electrically connected via the via-hole formed in the lower insulating layer, the resin component may not remain on the bottom surface of the via-hole in the presence of scale-like particles on the lower insulating layer, so connection reliability of both conductor layers improves.

Herein, the scale-like particles preferably have an aspect ratio (average length of particles/average thickness of particles) of 20 to 2,000. This reduces aggregation of scale-like particles in resin liquid at the time of forming the lower insulating layer. Additionally, if the aspect ratio is set within this range, connection reliability of both conductor layers becomes particularly excellent when the conductor layers placed on and below the lower insulating layer are electrically connected via the via-hole formed in the lower insulating layer. With regard to the scale-like particles, both the average length and the average thickness of particles are preferably less than the wavelength of light passing through the core (e.g., 850 nm) to prevent a loss of light transmitting through the core. In other words, the scale-like particles are added to the clad, but the scale-like particles move and are projected from the walls and the like of the clad when hardening the clad, and the projected scale-like particles may enter the core. If the size of the scale-like particles entering the core exceeds the transmission wavelength, a loss of light transmitting through the core occurs. Conversely, if the size of scale-like particles entering the core is less than the transmission wavelength, no loss occurs.

There is no particular limitation to the materials of scale-like particles, but examples may include inorganic materials, resin materials, and metal materials. Inorganic materials include, for example, aluminum compound, calcium compound, potassium compound, magnesium compound, silicon compound, titanium compound, and the like, in addition to mineral materials such as betonies, mica, clay, and montmorillonite, and may be one type of these or two or more of these types. Resin materials include, for example, heat-hardening resin, thermoplastic resin, photosensitive resin, partially acrylated heat-hardening resin, resin complex of heat-hardening resin and thermoplastic resin, and resin complex of photosensitive resin and thermoplastic resin, and may be one type of these or two or more of these types. Metal materials include, for example, gold, silver, copper, palladium, nickel, platinum, and the like, and may be one type of these or two or more of these types. Moreover, the scale-like particle content is not particularly limited, but it should contain 5-60 wt %, and preferably 10-30 wt %. Additionally, scale-like particles are contained in both the lower insulating layer and the upper insulating layer, and the lower insulating layer and the upper insulating layer containing the scale-like particles preferably have a coefficient of thermal expansion $\alpha 1$ (coefficient of thermal expansion up to glass transition point) of 40 to 60 $[\times 10^{-6}/^\circ C.]$ to prevent cracks near the optical waveguide and near the conductor layer.

An optical/electrical composite wiring board according to embodiments of the present invention may be any form of wiring board, such as a rigid wiring board, rigid flexible wiring board, flexible wiring board (optical waveguide film), and the like.

A manufacturing method of the optical/electrical composite wiring board according to an embodiment of the present invention comprises:

forming a lower insulating layer that serves as a lower clad of an optical waveguide, forming a core of said optical waveguide having a predetermined optical wiring pattern and a conductor layer having a predetermined electrical wiring pattern in said lower insulating layer, wherein forming said core includes at least one of the following: after forming a concave portion of an optical wiring having substantially the same pattern as said optical wiring pattern by press process, filling a core material into the concave portion for optical wiring so as to form said core; or, after forming concave portion for electrical wiring having substantially the same pattern as said electrical wiring pattern by press process, filling conductor material into the concave portion for electrical wiring so as to form said conductor layer, laminating an upper insulating layer that also serves as an upper clad of said optical waveguide on said lower insulating layer so as to cover said core and said conductor layer.

With this method of manufacturing the optical/electrical composite wiring board, the manufacturing method of forming a core by filling core material in the concave portion for optical wiring after the concave portion for optical wiring is formed in the lower insulating layer by press working is shorter than forming a convex core on the lower insulating layer. Additionally, the manufacturing method of forming a conductor layer by filling conductor material in the concave portion for electrical wiring after concave portion for electrical wiring is formed in the lower insulating layer by press working is shorter than forming a convex conductor layer on the lower insulating layer. As mentioned above, according to the method of manufacturing the optical/electrical composite wiring board, at least a core of an optical waveguide formed on the lower insulating layer or a conductor layer can be formed via a shorter manufacturing method, so the optical/electrical composite wiring board can be manufactured more easily, the yield rate improves compared to before, and the cost of manufacturing can be reduced.

With the method of manufacturing the optical/electrical composite wiring board according to embodiments of the present invention, during the process for forming a core, after said concave portion for optical wiring and said concave portion for electrical wiring are formed in said lower insulating layer by press working simultaneously, said core may be formed by filling said core material in said concave portion for optical wiring and said conductor layer may be formed by filling said conductor material in said concave portion for electrical wiring. Alternatively, during the process for forming the core, after said concave portion for optical wiring and said concave portion for electrical wiring are formed in said lower insulating layer simultaneously, said core and said conductor layer may be formed by filling said core material in said concave portion for optical wiring and covering the entire surface with said conductor material, and by filling said conductor material in said concave portion for electrical wiring and then grinding until the surface of said lower insulating layer is exposed. In either case, both the core and conductor layer can be formed via a shorter manufacturing process compared to before, and an optical wiring pattern and an electrical wiring pattern can be manufactured more easily, so the yield rate improves and the cost of manufacturing is further reduced.

With a method of manufacturing the optical/electrical composite wiring board according to embodiments of the present invention, during the process for forming the core, when said concave portion for electrical wiring is formed in said lower insulating layer, at least one part of the inner wall of the concave portion for electrical wiring is preferably roughened to improve adhesion between the concave portion for electrical wiring of the lower insulating layer and the conductor layer. Furthermore, if conductor material is filled in the concave portion for electrical wiring so as to form the conductor layer, the surface of the conductor layer is preferably roughened to improve reliability by improving adhesion between the conductor layer and the upper insulating layer.

With a method of manufacturing the optical/electrical composite wiring board according to embodiments of the present invention, during the process for forming the core, when said concave portion for optical wiring is formed in said lower insulating layer, an inclined surface with an angle of about 45° for the center axis is formed at both ends of the concave portion for optical wiring, and during the process of laminating the upper insulating layer, said upper insulating layer is preferably an outermost layer. This makes it possible to input/output optical signals orthogonally to the center axis of the core, so photonic devices such as VCSEL and PD can be implemented on the upper surface of the optical/electrical composite wiring board more easily. Additionally, when the optical signals entering the core of the optical waveguide and optical signals exiting the core are inputted externally and outputted externally, as long as they pass through only one upper insulating layer forming the upper clad, optical propagation loss due to inputting/outputting can be reduced.

With a method of manufacturing the optical/electrical composite wiring board according to embodiments of the present invention, in the process for forming a lower insulating layer, said lower insulating layer is preferably formed using insulating materials, in which scale-like particles are dispersed. When the concave portion for optical wiring is formed in the lower insulating layer, a dimensional constraint effect is caused due to the presence of the scale-like particles, so resin dripping of the concave portion for optical wiring is prevented, and formation stability improves. At the time of mass production, the core can be stable and formed into the same form, and no worsening of optical propagation loss caused by instability of formation is caused. On the other hand, in order to form the concave portion for electrical wiring in the lower insulating layer, resin dripping, etc., of the concave portion for electrical wiring is prevented because of the presence of the scale-like particles, and formation reliability improves. Therefore, at the time of mass production, electrical wiring can be stable and formed into the same formation, and matching of characteristic impedance with devices to be implemented is not disrupted, so the quality of signals to be transmitted is not lowered. Additionally, in the process for forming a core, when forming said conductor layer, after said concave portion for electrical wiring and a via-hole for connecting to a lower conductor layer placed below said lower insulating layer are formed by press working simultaneously, said conductor material may be filled in said concave portion for electrical wiring and said via-hole. This does not cause resin component to remain on the bottom surface of the via-hole because of the presence of the scale-like particles, so connection reliability of both conductor layers improves.

Moreover, in the specification, expressions of "upper," "lower," "left," "right," "front," and "back" are used, but they are used for only expressing relative positional relation. Therefore, for example, "upper" and "lower" can be replaced with "left" and "right."

Figure 1:
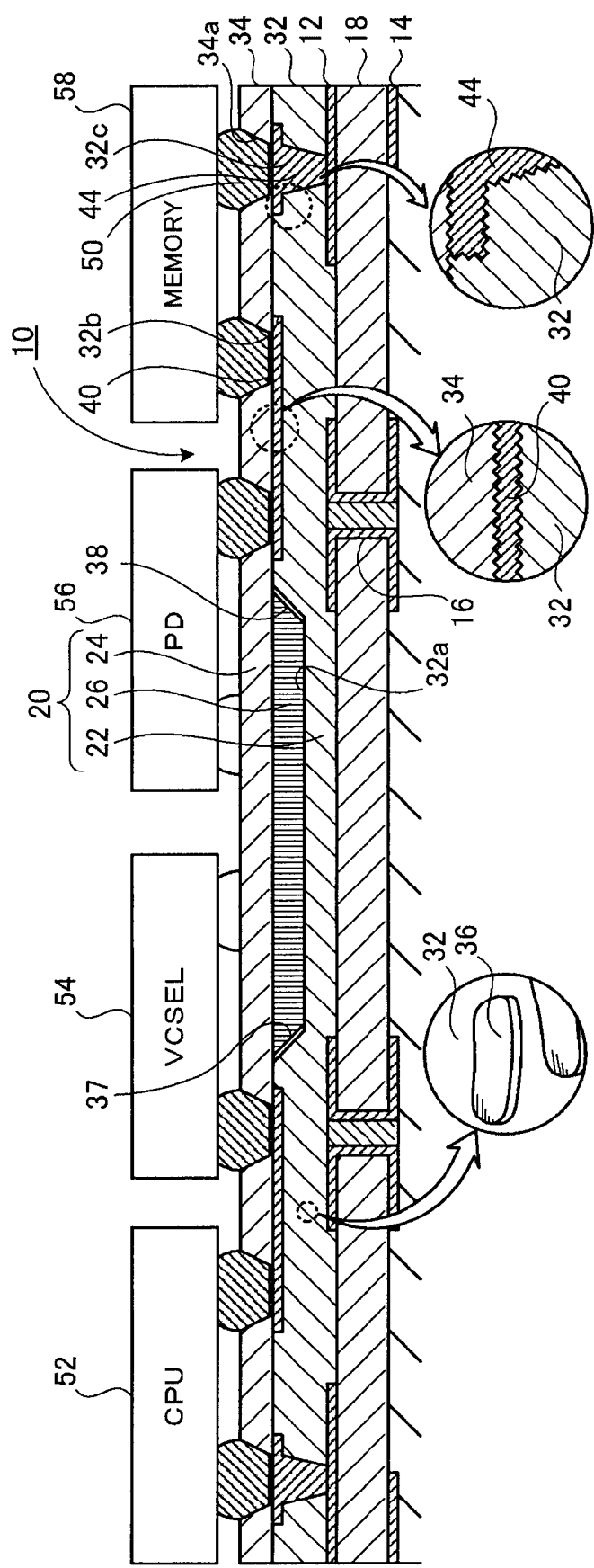
FIG. 1 is a cross-sectional view that shows an outline of the constitution of the optical/electrical composite wiring board 10.
Figure 2:
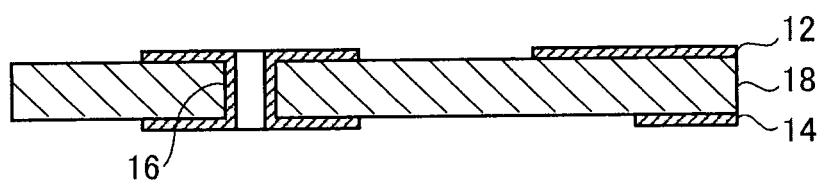
FIG. 2 is an explanatory drawing that shows a manufacturing step of the optical/electrical composite wiring board 10.
Figure 2:
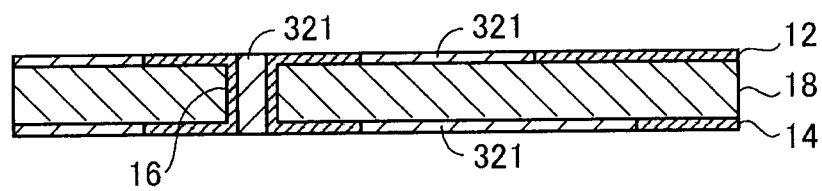
Figure 2:
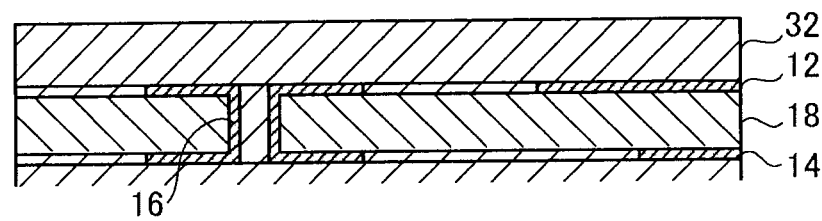
Figure 2:
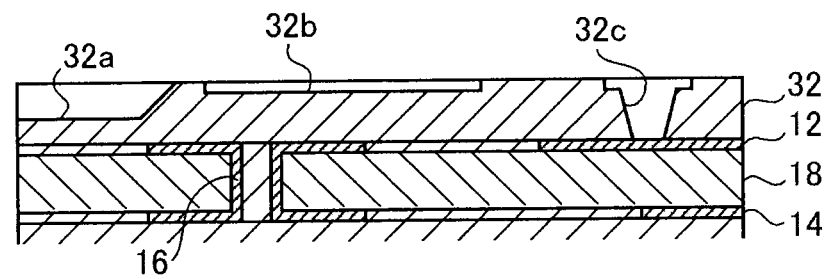
Figure 2:
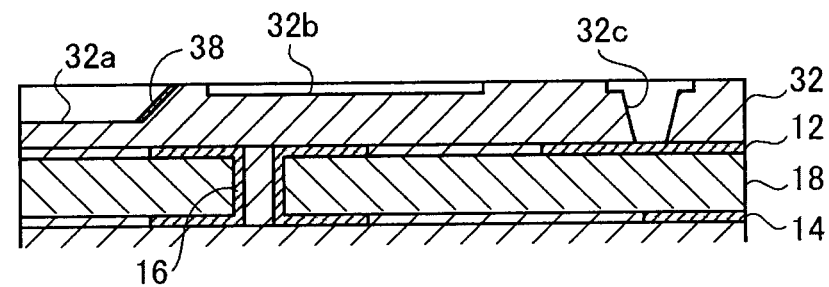
Figure 3:
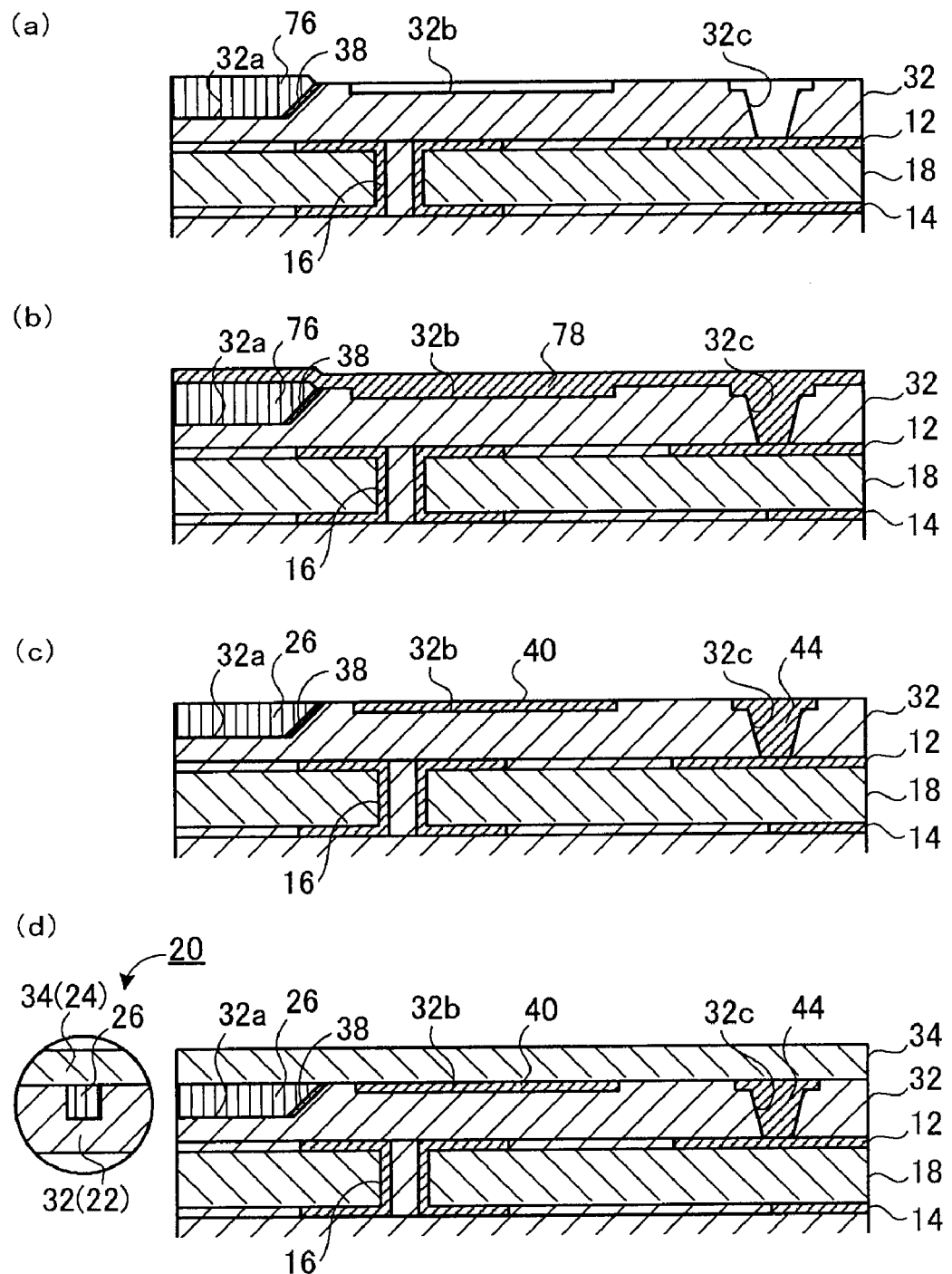
FIG. 3 is an explanatory drawing that shows a manufacturing step of the optical/electrical composite wiring board 10.
Figure 4:
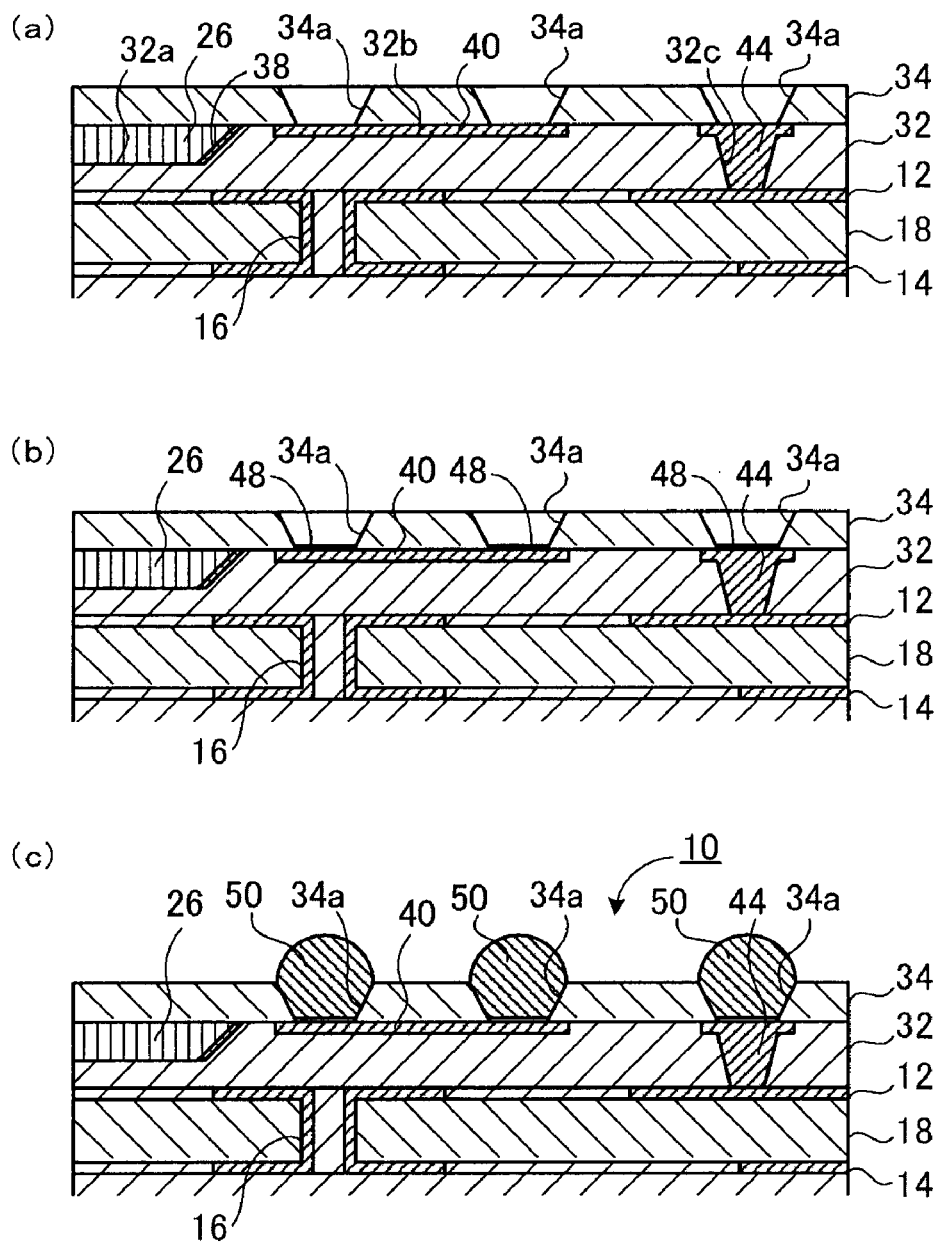
FIG. 4 is an explanatory drawing that shows a manufacturing step of the optical/electrical composite wiring board 10.

Next, example embodiments of the present invention are explained based on drawings. FIG. 1 is a cross-sectional view of the optical/electrical composite wiring board 10, which is one embodiment of the present invention (the inside of the circle is a partially enlarged view).

As shown in FIG. 1, the optical/electrical composite wiring board 10 of the embodiment comprises: a substrate 18; a lower insulating layer 32 that is laminated on the conductor layer 12 formed on the surface of the substrate 18 and serves as the lower clad 22 of the optical waveguide 20; an upper insulating layer 34 serving as the upper clad 24 of the optical waveguide 20; a core 26 that is placed between the lower insulating layer 32 and the upper insulating layer 34 and has a predetermined optical wiring pattern; a conductor layer 40 that is placed along with the core 26 between the lower insulating layer 32 and the upper insulating layer 34 and has a predetermined electrical wiring pattern; and a plurality of solder bumps 50 electrically connected to the conductor layer 40 for implementing various devices.

The substrate 18 consists of BT (Bismaleimide-Triazine) resin substrate, glass epoxy resin substrate, and the like, and has conductor layers 12 and 14 formed in a pattern consisting of copper on both the front and back surfaces and a through-hole conductor 16 consisting of copper formed on the inner periphery surface of the through-hole penetrating the front and back of the substrate 18, and both conductor layers 12 and 14 are electrically connected via the through-hole conductor 16.

The lower insulating layer 32, for example, consists of epoxy resin with a refractive index of 1.40 to 1.60 and contains scale-like particles 36, which have an aspect ratio of 20 to 2,000 and have either an average length or an average thickness of less than the wavelength of light emitted by VCSEL 54 (herein, 850 nm). The scale-like particles 36 consist of mineral materials such as bentonite and mica, and the coefficient of thermal expansion $\alpha 1$ may, for example, be bentonite: about 8 $[\times 10^{-6}/°$ C.] and synthetic mica: 6-14 $[\times 10^{-6}/°$ C.], and the coefficient of thermal expansion of resin can be reduced by adding an appropriate amount of this to the resin. The lower insulating layer 32 containing the scale-like particles 36 can be adjusted, for example, by adding the scale-like particles to epoxy resin with al of 80 $[\times 10^{-6}/°$ C.] so that the entire al becomes 50-60 $[\times 10^{-6}/°$ C.], and by adding the scale-like particles to epoxy resin with al of 65 $[\times 10^{-6}/°$ C.] so that the entire al becomes 40-50 $[\times 10^{-6}/°$ C.] and comprises the concave portion for optical wiring 32a with the core 26 of the optical waveguide 20 filled, the concave portion for electrical wiring 32b filled with copper forming the conductor layer 40 and the via-hole 32c similarly filled with copper. Among these, the concave portion for optical wiring 32a is formed by press working as described below, and the metal reflective layers 37 and 38 with an angle of 45° for the center axis of the core 26 are formed at both ends. Additionally, the concave portion for electrical wiring 32b and the via-hole 32c are also formed by press working, and the via-hole 32c reaches the conductor layer 12. The inner surfaces of the concave portion for electrical wiring 32b and the via-hole 32c are roughened so as to have fine concavity and convexity. Moreover, in view of the coefficient of thermal expansion of the insulating layer and the scale-like particles, the desired coefficient of thermal expansion of the insulating layer can be obtained by changing the content of the scale-like particle.

The upper insulating layer 34 consists of epoxy resin containing scale-like particles similar to the lower insulating layer 32 and a plurality of openings 34a reaching the conductor layer 40 from the upper surface therein. The upper insulating layer 34 can also contain the same scale-like particles as the lower insulating layer 32. The solder bumps 50 are formed in each of the openings 34a of the upper insulating layer 34.

The core 26 of the optical waveguide 20 is the core material which fills the concave portion for optical wiring 32a of the lower insulating layer 32. The core 26 consists of epoxy resin with a larger refractive index by 0.005 to 0.05 (preferably 0.01 to 0.03) than the lower insulating layer 32 and the upper insulating layer 34 and configures the optical waveguide 20 by being surrounded by the lower insulating layer 32 that serves as the lower clad 22 and the upper insulating layer 34 that serves as the upper clad 24. Additionally, the upper surface of the core 26 is flat with the lower insulating layer 32. The core 26 employs cores with transmissivity of more than 90%/mm so as to keep the optical propagation loss minimal.

The conductor layer 40 is copper which fills the concave portion for electrical wiring 32b provided in the lower insulating layer 32 by a plating method. The upper surface of the conductor layer 40 is flat with the upper surface of the lower insulating layer 32. Additionally, the via-hole conductor 44 is copper which fills the via-hole 32c provided in the lower insulating layer 32 filled with copper and connects the conductor layer 12 placed on the lower side of the lower insulating layer 32 to the conductor layer 40 placed on the upper side electrically. The upper surface of the conductor layer 40 and the upper surface of the via-hole conductor 44 are roughened so as to have fine concavity and convexity.

Next, examples of use of the optical/electrical composite wiring board 10 are explained. If the CPU 52, the VCSEL 54, the PD 56, and the memory chip 58 are implemented by flip-chip method on the optical/electrical composite wiring board 10 via the solder bumps 50, power is supplied to them via electrical wiring (wiring consisting of the conductor layer 12, 14, and 40, and the via-hole conductor 44, the through-hole conductor 16, and the like). Additionally, various signals can be exchanged via electrical wiring and the optical waveguide 20. For example, electrical signals of the CPU 52 are outputted vertically downward by the VCSEL 54 via a driver IC, which is not shown, as optical signals. The driver IC may be included in the CPU 52 or may be placed separately from the CPU 52. After the optical signals pass through the upper insulating layer 34 of the optical/electrical composite wiring board 10 and reflect on the metal reflective layer 37 formed on one end of the core 26 to turn horizontally, they hit the interface of the core 26 and the lower insulating layer 32 (or the upper insulating layer 34) at an angle larger than the critical angle, progress in a zigzag pattern by repeating total reflection to reach the other end of the core 26, and afterward, they reflect on the metal reflective layer 38 formed on the other end to turn vertically upward and are outputted externally via the upper insulating layer 34. Afterward, the optical signals are inputted into the PD 56 and inputted into the memory chip 58 via an amplifier IC, which is not shown, as electrical signals. The amplifier IC may be included in the memory 58 or may be placed separately from the memory 58.

Next, with regard to the method for manufacturing the optical/electrical composite wiring board 10, the outline is explained briefly. Details of the manufacturing method are explained in the embodiments below. In order to manufacture the optical/electrical composite wiring board 10, (a) a film for an inter-layer insulating layer (the lower insulating layer 32) that serves as the lower clad 22 of the optical waveguide 20 is laminated on the front side of the substrate 18. Conductor layers 12 and 14 are provided on both front and back surfaces of the substrate 18 and are electrically connected by way of the through-hole conductor 16; (b) the core 26 that has a predetermined optical wiring pattern and the conductor layer 40 that has a predetermined electrical wiring pattern are formed in the lower insulating layer; and (c) an inter-layer insulating film (the upper insulating layer 34) that serves as the upper clad 24 of the optical waveguide 20 is laminated on lower insulating layer 32 so as to cover the core 26 and the conductor layer 40.

Herein, in the process of forming the core and the conductor layer, after the concave portion for optical wiring 32a that has the same pattern as an optical wiring pattern of the core 26 and the concave portion for electrical wiring 32b that has the same pattern as an electrical wiring pattern on the conductor layer 40 are formed, core material is filled in the concave portion for optical wiring 32a to form the core 26, and conductor material is filled in the concave portion for electrical wiring 32b to form the conductor layer 40, and afterward, they are ground until the surface of the lower insulating layer 32 is exposed. In the process of forming the core and the conductor layer, when press working, 45°-inclined surfaces at both ends of the concave portion for optical wiring 32a and the via-hole 32c are also formed at the same time, and before the concave portion for optical wiring 32a is filled with core material, the metal reflective layers 37 and 38 are formed on the 45°-inclined surfaces, and when conductor material is filled in the concave portion for electrical wiring 32b to form the conductor layer 40, conductor material is filled in the via-hole 32c to form the via-hole conductor 44 at the same time. Furthermore, in the process of laminating the inter-layer insulating film, after the upper insulating layer 34 is laminated on the lower insulating layer 32, the openings 34a is formed in the upper insulating layer 34 using a laser to form the solder bumps 50.

According to the optical/electrical composite wiring board 10 of the embodiment described in detail above, the core material and conductor material are filled in the concave portion for optical wiring 32a and the concave portion for electrical wiring 32b formed in the lower insulating layer 32, respectively, so as to form the core 26 and the conductor layer 40, so the core 26 and the conductor layer 40 can be formed in a shorter manufacturing process compared to conventional forming of a convex core and a convex conductor layer on the lower insulating layer 32. Therefore, the optical/electrical composite wiring board 10 can be manufactured more easily than before with improved yield rate and reduced manufacturing cost.

Moreover, each inner surface of the concave portion for optical wiring 32a, the concave portion for electrical wiring 32b, and the via-hole 32c have roughened surfaces, so adhesion between the concave portion for electrical wiring 32b and the conductor layer 40 and adhesion between the via-hole 32c and the via-hole conductor 44 are improved. Additionally, the upper surface of the conductor layer 40 and the upper surface of the via-hole conductor 44 are also roughened surfaces, so adhesion between them and the upper insulating layer 34 is improved, so peeling and cracking do not really occur, and reliability at the beginning and for long-term use is improved.

Furthermore, the core 26 has metal reflective layers 37 and 38 that are inclined at 45° from the center axis of the core 26 at both ends, the upper insulating layer 34 forms an outermost layer, and optical signals can be inputted/outputted approximately orthogonally to the center axis of the core 26, so the VCSEL 54 and the PD 56 are easily implemented on the upper surface of the optical/electrical composite wiring board 10. Additionally, optical signals entering the core 26 of the optical waveguide 20 and optical signals exiting the core 26 can be inputted externally and outputted externally if they pass through only one layer of the upper insulating layer 34 forming the upper clad 24, so optical propagation loss due to inputting/outputting can be reduced.

Furthermore, the lower insulating layer 32 contains scale-like particles 36, so resin dripping and the like of the concave portion for optical wiring 32a, the concave portion for electrical wiring 32b, and the via-hole 32c formed in the lower insulating layer 32 are prevented by the scale-like particles 36, thus improving formation stability. Therefore, at the time of mass production, the core 26 can be formed into the same form stably, and no worsening of optical propagation loss due to instability of formation is caused, and at the time of mass production, the conductor layer 40 can be formed into the same form stably, and matching of characteristic impedance with devices to be implemented is not disrupted, so the quality of signals to be transmitted is not lowered. Additionally, if the scale-like particles 36 are present on the lower insulating layer 32, resin components do not remain on the bottom surface of the via-hole 32c, so connection reliability between the conductor layer 12 and the via-hole conductor 44 and also connection reliability between the conductor layer 12 and the conductor layer 40 are improved.

Moreover, the lower insulating layer 32 and the upper insulating layer 34 containing the scale-like particles 36 have a coefficient of thermal expansion $\alpha 1$ of 40-60 [$\times 10^{-6}$/° C.], so cracks do not occur near the optical waveguide 20 and the conductor layer 40.

Furthermore, the scale-like particles 36 have an aspect ratio (average length of the particles/average thickness of the particles) of 20 to 2,000, and both the average length and the average thickness of the particles are less than the wavelength of light passing through the core 26, so when forming the lower insulating layer 32, no aggregation of the scale-like particles in resin solution occurs, and light can pass through the upper insulating layer 34 containing the scale-like particles 36 with low propagation loss.

Furthermore, when the aspect ratio of the scale-like particles 36 is 20 to 2,000, connection reliability between the conductor layers 12 and 40 placed on and below the lower insulating layer 32 via the via-hole 32c formed on the lower insulating layer 32 becomes particularly excellent.

Additionally, the present invention is not limited to the embodiments described above, so needless to say, it can be implemented in various embodiments as long as it conforms to the technical scope of the present invention.

For example, in the embodiments described above, the concave portion for optical wiring 32a formed in the lower insulating layer 32 is filled with core material to form the core 26, and the concave portion for electrical wiring 32b formed in the lower insulating layer 32 is filled with conductor material to form the conductor layer 40. The core 26 is formed using the concave portion for optical wiring 32a, but the conductor layer may be formed into a convex on the lower insulating layer 32 using an exposure development method, and the conductor layer 40 is formed using the concave portion for electrical wiring 32b, but the core may be formed into convex on the lower insulating layer 32 using an exposure development method. As mentioned above, even when only the core 26 or the conductor layer 40 is formed using the concave portion, the manufacturing process becomes shorter than when forming it into a convex using an exposure development method, so it can be manufactured more easily than before, the yield rate is improved, and the cost of manufacturing can be reduced.

Furthermore, in the embodiments described above, the lower insulating layer 32 and the upper insulating layer 34 contain scale-like particles 36, but they may not contain scale-like particles 36. Even if the lower insulating layer 32 and the upper insulating layer 34 do not contain scale-like particles 36, if the core 26 and the conductor layer 40 are formed using the concave portion for optical wiring 32a and the concave portion for electrical wiring 32b, respectively, benefits can still be obtained, such as simplified manufacturing and improved yield rate and the reduced cost of manufacturing.

Furthermore, in the embodiments described above, the lower insulating layer 32, the core 26, the conductor layer 40, and the upper insulating layer 34 are placed on the substrate 18, accordingly, one by one, but the lower insulating layer 32, the core 26, and the conductor layer 40 may be laminated in a multistage process onto the substrate 18, and finally, the upper insulating layer 34 may be placed.

Furthermore, in the embodiments described above, the bottom surface and sidewalls of the concave portion for electrical wiring 32b and the via-hole 32c are roughened; however, it is also possible to apply electroless plating or electrolytic plating after forming a sputter layer through a sputtering process without roughening.

Moreover, in the embodiments described above, the optical/electrical composite wiring board 10 is a rigid substrate as shown in FIG. 1, but it may be an optical waveguide film (flexible substrate) that has a core 26 and a conductor layer 40 between the lower insulating layer 32 and the upper insulating layer 34. For example, for cell phones, a substrate in a body part and a substrate in a liquid crystal part may be connected by optical waveguide films with VCSEL and PD so that optical waveguide films can be folded for use, signals of large-size images can be transmitted via optical wiring, and small-volume signals, power supply, and ground can be distributed via electrical wiring.

Example embodiments of the invention will now be discussed. As would be understood by one of ordinary skill in the art, the specific embodiments herein discussed may be used alone or in combination with each other.

Embodiment 1

Embodiment 1-1

Specific methods for manufacturing the optical/electrical composite wiring board 10 are explained in detail below. First, methods for preparing films for the inter-layer insulating layer and the filling resin composition required for manufacturing the optical/electrical composite wiring board 10 are explained.

The film for the inter-layer insulating layer is prepared as follows. First, 75 g of scale-like particles (Hojun Co., Ltd.; product name: Esben C; aspect ratio at the time of dispersion: –500; crystal size (maximum length): 0.5 μm) are added to a mixed solvent of 20 g of methyl ethyl ketone (MEK) and 80 g of xylene and mixed with two rollers to make a mixture containing scale-like particles. Then, 180 parts by weight of the mixture containing the scale-like particles, 40 parts by weight of bisphenol A epoxy resin (Yuka-Shell Epoxy Co., Ltd.; product name: E-1001), 60 parts by weight of phenol novolac epoxy resin (Yuka-Shell Epoxy Co., Ltd.; product name: E-154), 5 parts by weight of imidazole hardening agent (Shikoku Chemicals Corporation; product name: 2PHZ), and 75 parts by weight of butyl cellosolve acetate are stirred and mixed with three rollers to prepare a film precursor. The scale-like particles at this time are 21 wt % as solids. The film precursor is coated onto a 50-μm film made of polymethylpentane (Mitsui Petrochemical Industries, Ltd.; Product name: Opulen X-88, softening point: 180° C.) using a roll-coater (Cermatronics Boeki Co., Ltd.), and afterwards, it is dried to be hardened at 80° C. for 2 hours, at 120° C. for 5 hours, and at 150° C. for 2 hours to make a film for a 40-μm-thick inter-layer insulating layer. When the film for the inter-layer insulating layer was observed for minimum crystal size at the time of dispersion using a transmission electron microscope at 50,000 to 100,000 times, it was 0.1 μm. Therefore, the aspect ratio of the scale-like particles contained in the film for inter-layer insulating layer is 100 to 500. Additionally, in order to use the film for an inter-layer insulating layer as a clad, materials in which a predetermined ratio of proton in epoxy resin (-H) was replaced with fluorine (-F) or deuterium (-D) in advance were used or materials with refractive index adjusted within 1.4 to 1.6 by adding a predetermined ratio of sulfur to the materials (herein, adjusted to about 1.5) were used.

The filling resin composition is prepared as follows. Specifically, 100 parts by weight of bisphenol F epoxy monomer (Yuka-Shell Epoxy Co., Ltd.; molar weight: 310, product name: YL983U), 72 parts by weight of SiO2 spherical shape particles (Admatechs Company Limited; product name:

CRS1101-CE) whose surface is coated with silane coupling agent, an average particle diameter of 1.6 µm and a diameter of the largest particles of 15 µm or less, and 1.5 parts by weight of leveling agent (San Nopco Limited; product name: Pelenol S4) are put into a container to be stirred and mixed so that filling resin compositions with a viscosity of 23±1° C. and 30 to 60 Pas are obtained. Additionally, as a hardening agent, 6.5 parts by weight of imidazole hardening agent (Shikoku Chemicals Corporation; product name: 2E4MZ-CN) are used.

Next, a method for manufacturing the optical/electrical composite wiring board 10 is explained based on FIG. 2 to FIG. 5 below. FIG. 2 to FIG. 5 are explanatory drawings that show the steps for manufacturing the optical/electrical composite wiring board 10. However, FIG. 2 to FIG. 5 show only the right half of the optical/electrical composite wiring board 10 shown in FIG. 1.

First, a double-sided copper clad laminate laminated with 12-µm copper foil on both surfaces of an insulating substrate consisting of a 0.8-mm-thick glass epoxy resin or BT (Bis-maleimide-Triazine) resin is used as a starting material, and a predetermined position on the double-sided copper clad laminate is drilled so as to form a through-hole. Next, after it is electroless plated and electroplated accordingly, it is etched into a pattern so as to form the conductor layers 12 and 14 and the through-hole conductor 16 for connecting both conductor layers 12 and 14 electrically on both surfaces of the substrate 18 (Refer to FIG. 2(a)).

Next, tanning treatment with a solution containing NaOH (10 g/L), NaClO$_2$ (40 g/L), and Na$_3$PO$_4$ (6 g/L) as a tanning bath (oxidizing bath) and reduction treatment with a solution containing NaOH (10 g/L) and NaBH$_4$ (6/L) as a reduction bath are performed on the substrate 18 on which are formed the conductor layers 12 and 14 and the through-hole conductor 16, to make the surface of the conductor layers 12 and 14 and the through-hole conductor 16 into roughened surfaces. Then, the filling resin composition mentioned above is filled in gaps of the conductor layer 12, gaps of the conductor layer 14, and the inside of the through-hole using a squeegee and dried at 100° C. for 20 minutes. Next, the front and back surfaces of the substrate 18 are planarized using a belt sander or buffer or the like until the surface of the conductor layers 12 and 14 and the land surface of the through-hole conductor 16 are exposed and heated at 100° C. for 1 hour and at 150° C. for 1 hour so as to form the resin layer 321 by hardening the filling resin composition and, furthermore, to tan the surfaces of the conductor layers 12 and 14 and the land surface of the through-hole conductor 16 (Refer to FIG. 2(b)).

Next, the film for the inter-layer insulating layer mentioned above is limited by vacuum pressure bonding on both surfaces of the substrate 18 at a temperature of 50 to 150° C. under 0.5 MPa of pressure so as to form the lower insulating layer 32 (Refer to FIG. 2(c)). The lower insulating layer 32 has a refractive index of 1.500 and transmissivity of more than 99%/mm. Hereafter, a process of laminating the surface of the substrate 18 will be explained.

Figure 5:
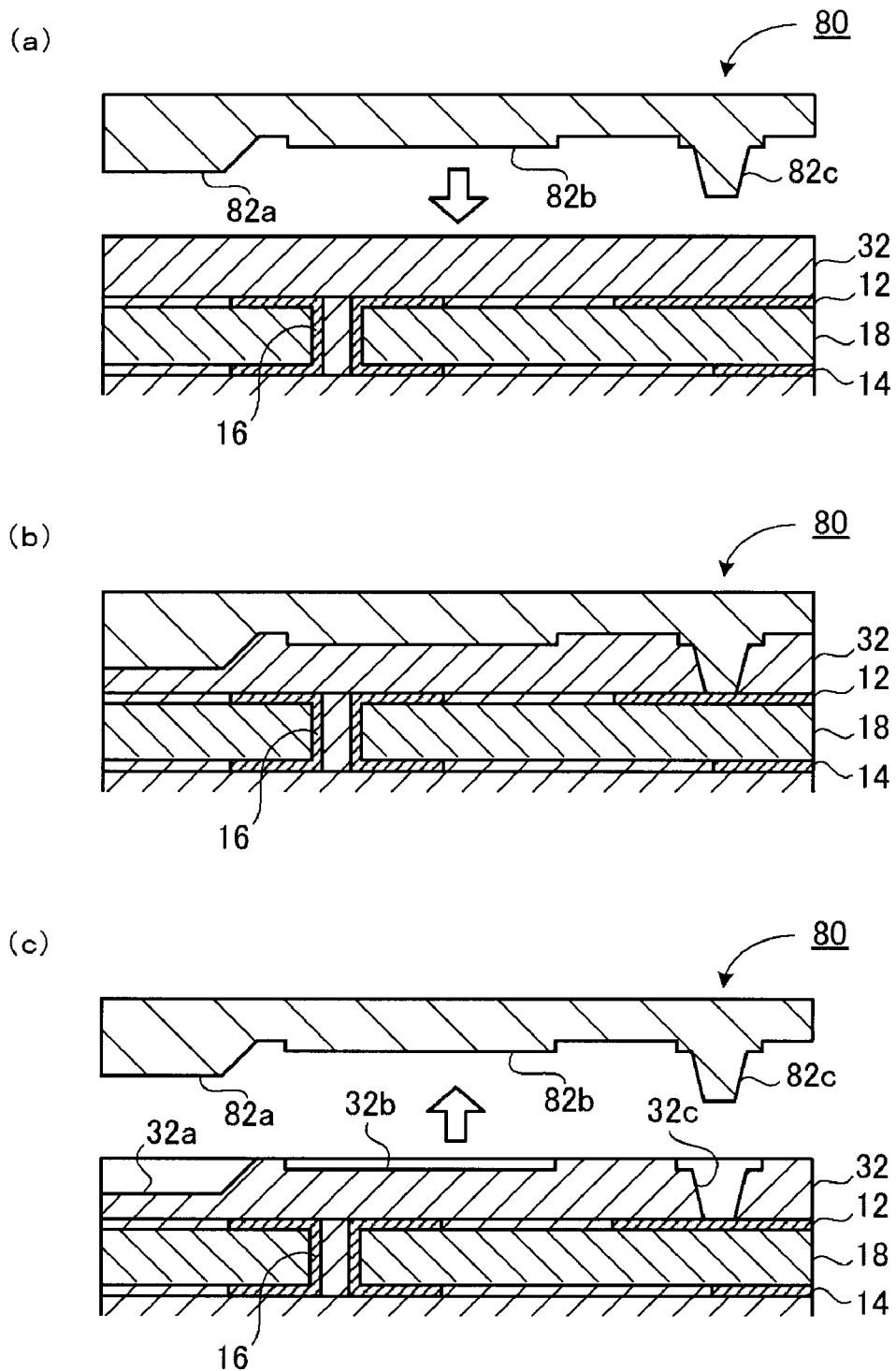
FIG. 5 is an explanatory drawing that shows a manufacturing step of the optical/electrical composite wiring board 10.

Next, as shown in FIG. 5, the mold 80 (made of nickel, for example) for press working, comprising the convex portion for optical wiring 82a for forming the concave portion for optical wiring 32a, the convex portion for electrical wiring 82b for forming the concave portion for electrical wiring 32b, and the convex portion for via-hole 82c for forming the via-hole 32c on the lower surface is prepared (Refer to FIG. 5(a)). The mold 80 is pressed on the lower insulating layer 32 under a temperature condition (110° C.) that shows the minimum melt viscosity under 0.8 MPa of pressure for 3 minutes (Refer to FIG. 5(b)), and afterward, when it is cooled down to 70° C., the mold 80 rises to be removed from the lower insulating layer 32, and the lower insulating layer 32 is completely hardened by heating at 150° C. for 1 hour (Refer to FIG. 5(c)). Thus, the concave portion for optical wiring 32a that has 45°-inclined surfaces at both ends, the concave portion for electrical wiring 32b that has the same pattern as the electrical wiring pattern, and the via-hole 32c of an inverted cone shape are formed in the lower insulating layer 32 at the same time (Refer to FIG. 2(d)).

A mold with the following shape is used as the mold 80 used in the press work mentioned above. Specifically, the shape of the convex portion for optical wiring 82a forms an optical wiring pattern with a minimum line width of 10 µm and a minimum conductor spacing of 10 µm (L/S=10/10 µm, wherein L is the minimum line width and S is the minimum conductor spacing), and it is designed to have a projection of 15 µm. The shape of the convex portion for electrical wiring 82b forms an electrical wiring pattern with a minimum line width of 10 µm and a minimum conductor spacing of 10 µm (L/S=10/10 µm), and it is designed to have a projection of 45 µm. The shape of the convex portion for the via-hole 82c is formed into a circular truncated cone shape that is 70 µm in diameter for the upper bottom and 50 µm in diameter for the lower bottom and has 45 µm of projection (equivalent to the depth of the via-hole).

Next, a commercially available photosensitive dry film is attached to the entire surface of the lower insulating layer 32, and a photomask with a transparent part is placed in a position opposite to the 45°-inclined surface to be exposed and developed so that parts other than the 45°-inclined surface are covered with a dry film, and it is sputtered under an argon atmosphere with a condition of output of 200 W, time of 30 minutes, and pressure of 0.6 Pa so as to form the metal reflective layers 37 and 38 made of Ti/Pt/Au on the 45°-inclined surface and peel the dry film afterward (Refer to FIG. 2(e), the figure shows the metal reflective layer 38 only).

Next, as a core material, an appropriate amount of sulfur is added to resin materials having the same composition as the film for the inter-layer insulating layer mentioned above (however, not containing scale-like particles) to make a refractive index of 1.520, and the core material is filled in the concave portion for optical wiring 32a selectively using a squeegee and is dried at 150° C. for 60 minutes. Additionally, the core material is filled so that it rises from the upper surface of the lower insulating layer 32 to make the core material excess filler 76 (Refer to FIG. 3(a)).

Next, the wiring board being manufactured is immersed in solution containing 60 g/L of permanganic acid at 80° C. for 10 minutes to roughen the surface of the lower insulating layer 32 (including the bottom surface and sidewalls of the concave portion for electrical wiring 32b and the via-hole 32c). Next, the wiring board is immersed in a neutralizing solution (Shipley Company L.L.C) and is washed with water, and it is further immersed in a catalyst solution containing palladium chloride and stannous chloride to separate out palladium metal so that a palladium catalyst is applied to the surface of the lower insulating layer 32 as a catalyst core (not shown). Next, the wiring board being manufactured is immersed in an electroless plating solution (copper sulfate: 0.800 mol/L; EDTA: 0.030 mol/L; HCHO: 0.050 mol/L; NaOH: 0.100 mol/L; α, α'-bipyridyl: 100 mg/L; polyethyleneglycol (PEG): 0.10 g/L) so as to form an electroless copper plating film of 0.6 to 3.0 µm in thickness on the surface of the sputter layer. At this time, the electroless plating condition is at a solution temperature of 34° C. for 40 minutes. Next, an electro copper plating film of 50 µm in thickness is formed on the electroless copper plating film using electro plating solution (sulfuric acid: 2.24 mol/L; copper sulfate: 0.26 mol/L; additive (Atotech Japan, Kaparacid GL) 19.5 ml/L) to make the conductor covering layer 78. At this time, the electro plating condition is at a current density of 3 A/dm$^2$, a time of 65 minutes, and a temperature of 22±2° C. The conductor covering layer 78 makes the concave portion for the electrical wiring 32b and the via-hole 32c completely filled with copper and completely covers the entire surface of the lower insulating layer 32 with copper (Refer to FIG. 3(b)).

Additionally, instead of roughening, a sputtered thin film may be formed on the entire surface of the lower insulating layer 32 (including the surface of the core material filled in the concave portion for optical wiring). In other words, by sputtering under argon atmosphere, and the condition of output: 200 W, time: 30 minutes, and pressure: 0.6 Pa, a sputtered thin film made of Ti/Cu may be formed on the whole surface of the lower insulating layer 32, including the bottom surface and sidewalls of the concave portion for electrical wiring 32b and the via-hole 32c and the surface of the core material excess filler 76.

Next, a wiring board, on which the conductor covering layer 78 is formed, is ground to be planarized using a belt sander or buffer and the like until the surface of the lower insulating layer 32 is exposed so that the conductor layer 40 that has a predetermined electrical wiring pattern and the upper end of the via-hole conductor 44 are exposed (Refer to FIG. 3(c)). This makes the upper surface of the lower insulating layer 32, the upper surface of the conductor layer 40, and the upper surface of the via-hole conductor 44 flat.

Next, tanning treatment, with a solution containing NaOH (10 g/L), NaClO$_3$ (40 g/L), and Na$_3$PO$_4$ (6 g/L) as tanning bath (reduction bath) and reduction treatment, with a solution containing NaOH (10 g/L) and NaBH$_4$ (6 g/L) as reduction bath, are conducted for ground substrate to make the surface of the conductor layer 40 and the via-hole conductor 44 into roughened surfaces. Next, the film for the inter-layer insulating layer mentioned above is laminated by vacuum pressure bonding at a temperature of 50 to 150° C. under a pressure of 0.5 MPa so as to form the upper insulating layer 34 (Refer to FIG. 3(d)). Inside the circle on the left in FIG. 3(d) is a cross-sectional view when the optical waveguide 20 is cut vertically to the center axis.

Next, the openings 34a of 50 to 200 μm in diameter are formed on the upper insulating layer 34 using a carbon dioxide gas laser of 10.6 μm in wavelength under the condition of pulse width: 10 to 25μ/second, diameter of the through-hole of the mask: ø1.5 to 6.0 mm, and 1 to 10 shots. This makes a predetermined part of the conductor layer 40 and the upper surface part of the via-hole conductor 44 exposed externally through each of the openings 34a (Refer to FIG. 4(a)).

Next, a wiring board, with a plurality of openings 34a on the upper insulating layer 34, is immersed in electroless nickel plating solution of pH=5 consisting of 30 g/L of nickel chloride, 10 g/L of sodium hypophosphite, and 10 g/L of sodium citrate for 20 minutes so as to form a nickel plating layer of 5 μm in thickness on the bottom surface of the openings 34a. Furthermore, the substrate is immersed in electroless gold plating solution consisting of 2 g/L of gold potassium cyanide, 75 g/L of ammonium chloride, 50 g/L of sodium citrate, and 10 g/L of sodium hypophosphite at 93° C. for 23 seconds so as to form a gold plating layer of 0.03 μm in thickness on the nickel plating layer. This forms the metal layer 48, on which a nickel plating layer and gold plating layer are laminated, on the bottom surface of the openings 34a (that is, the upper surface part of the conductor layer 40 or the via-hole conductor 44) (Refer to FIG. 4(b)).

Finally, the solder bumps 50 are formed by printing solder past on each of the openings 34a of the upper insulating layer 34 and reflowing it at 200° C. so as to make the optical/electrical composite wiring board 10 that has the solder bumps 50 (Refer to FIG. 4(c)).

Embodiment 1-2

In Embodiment 1-2, the optical/electrical composite wiring board 10 is manufactured in a similar way to Embodiment 1-1, except that, when preparing a precursor of the film for inter-layer insulating layer, 15 g of scale-like particles is added to make a mixture containing scale-like particles, and the scale-like particle content in the precursor is made 6.5 wt % as solids.

Embodiment 1-3

The optical/electrical composite wiring board 10 is manufactured in a similar way to Embodiment 1-1, except that, when preparing a precursor of the film for the inter-layer insulating layer, 36 g of scale-like particles is added to make a mixture containing scale-like particles, and the scale-like particle content in the precursor is made 13 wt % as solids in Embodiment 1-3.

Embodiment 1-4

The optical/electrical composite wiring board 10 is manufactured in a similar way to Embodiment 1-1, except that, when preparing a precursor of the film for the inter-layer insulating layer, 218 g of scale-like particles is added to make a mixture containing scale-like particles, and the scale-like particle content in the precursor is made 34 wt % as solids in Embodiment 1-4.

Embodiment 2

In Embodiment 2, the optical/electrical composite wiring board 10 is manufactured in a similar way to Embodiment 1-1 except that the Product name: NANOFIL manufactured by Topy Industries Ltd. (synthetic mica, aspect ratio after dispersion: 100-500, particles size (length): 0.1-0.5 μm, thickness of the maximum particles: 0.1 μm) is used as scale-like particles.

Embodiment 3

In Embodiment 3, the optical/electrical composite wiring board 10 is manufactured in a similar way to Embodiment 1-1 except that Product name: Micro mica MK-100F manufactured by Co-op Chemical (synthetic mica, aspect ratio: 20-30, particles size (length): 1-3 μm) is used as scale-like particles.

Embodiment 4

In Embodiment 4, the optical/electrical composite wiring board 10 is manufactured in a similar manner to that of Embodiment 1-1, except that Orga Night D, manufactured by Hojun Co., Ltd. (organic bentonite; aspect ratio after dispersion: 100 to 2,000; crystal size (length) at the time of dispersion: up to 2.0 μm), is used for the scale-like particles.

Embodiment 5

In Embodiment 5, the optical/electrical composite wiring board 10 is manufactured in a similar manner to that of Embodiment 1-1, except that the film for the inter-layer insulating layer does not contain scale-like particles.

Embodiment 6

In Embodiment 6, the optical/electrical composite wiring board 10 is manufactured in a similar manner to that of Embodiment 1-1, except that Polyfil DL, manufactured by Sanyo Trading Co., Ltd. (delaminated clay; average particles diameter size (length): 1 μm; aspect ratio: 7 to 10), is used for the scale-like particles.

Embodiment 7

In Embodiment 7, the optical/electrical composite wiring board 10 is manufactured in a similar manner to that Embodiment 1-1, except that SOMASIF MPE, manufactured by Coop Chemical (synthetic mica; aspect ratio: 5000 to 7,000; average size (average length): 5 to 7 μm; swellable particles), is used for the scale-like particles.

Embodiment 8

Embodiment 8-1

In Embodiment 8-1, the optical/electrical composite wiring board 10 is manufactured in a similar manner to that of Embodiment 1-1, except that the spherical shape silica particles of SO-E6, manufactured by Admatechs Company Limited (particles diameter: 1.5 to 2.5 μm), are used instead of the scale-like particles when manufacturing the film for the inter-layer insulating layer.

Embodiment 8-2

In Embodiment 8-2, the optical/electrical composite wiring board 10 is manufactured in a similar manner to that of Embodiment 1-1, except that spherical shape silica particles of Product name: SO-E2 manufactured by Admatechs Company Limited (particles diameter: 0.4 to 0.6 μm) are used instead of the scale-like particles when manufacturing the film for the inter-layer insulating layer.

Embodiment 9

Figure 6:
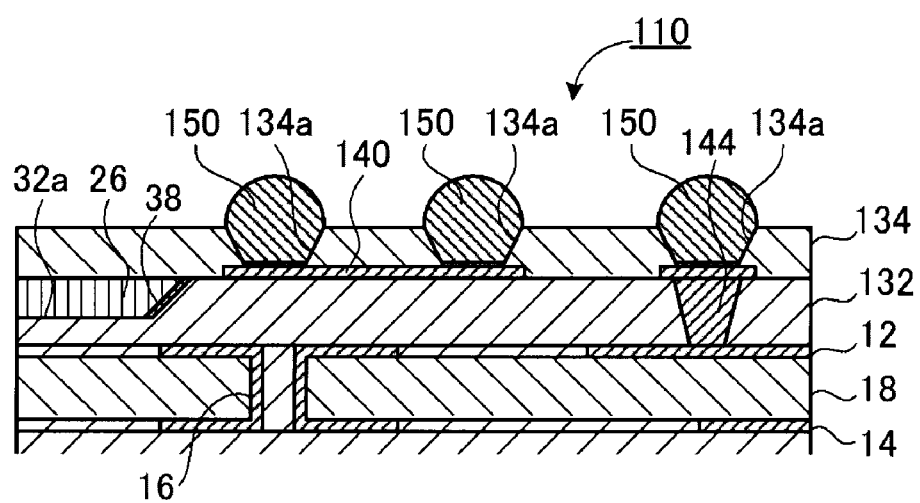
FIG. 6 is a cross-sectional view that shows an outline of the constitution of the optical/electrical composite wiring board 110.
Figure 7:
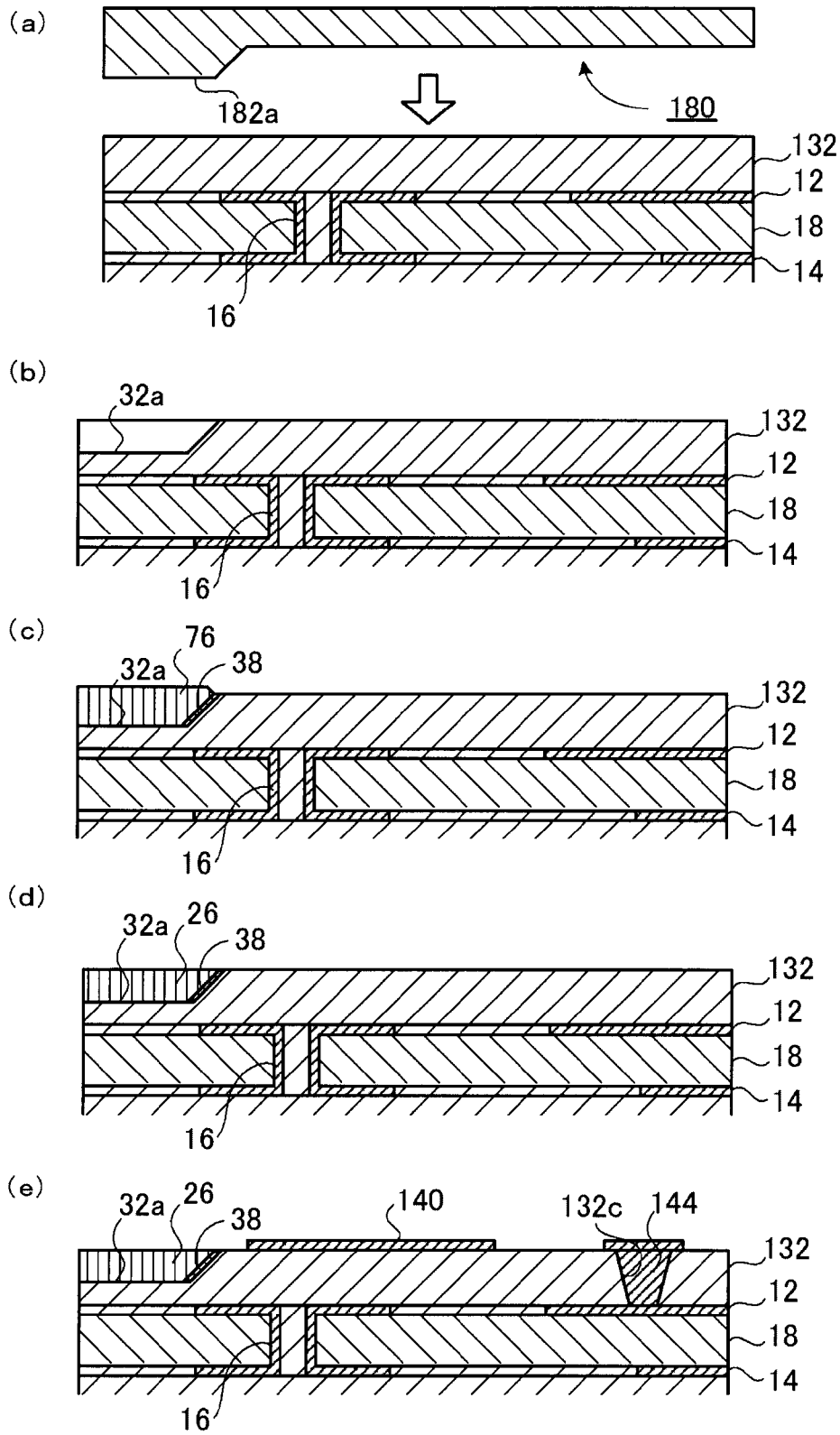
FIG. 7 is an explanatory drawing that shows a manufacturing step of the optical/electrical composite wiring board 110.

In Embodiment 9, the optical/electrical composite wiring board 110, shown in FIG. 6, is manufactured. The optical/electrical composite wiring board 110 comprises: a lower insulating layer 132 that also serves as the lower clad of the optical waveguide; an upper insulating layer 134 that also serves as the upper clad of the optical waveguide; a core 26 of the optical waveguide, which is placed between the lower insulating layer 132 and the upper insulating layer 134 and has a predetermined optical wiring pattern; and a conductor layer 140, which is placed along with the core 26 between the lower insulating layer 132 and the upper insulating layer 134 and has a predetermined electrical wiring pattern, wherein the core 26 is formed by filling core materials in the concave portion for optical wiring 32a placed in the lower insulating layer 132, and the conductor layer 140 is formed into a convex shape on the lower insulating layer 132. Additionally, while only the concave portion for optical wiring 32a that has approximately the same pattern as the predetermined optical wiring pattern is formed by press working, so as to form the core 26 using the concave portion for optical wiring 32a after the inter-layer insulating layer film in Embodiment 1-1 is attached to the conductor layer 12 placed on the surface of the substrate 18, the conductor layer 140 and the via-hole conductor 144 are manufactured using an exposure development method. The manufacturing method is explained in detail based on FIG. 7 below.

First, the mold 180 for press working, which comprises the convex portion for optical wiring 182a for forming the concave portion for optical wiring 32a on the lower surface, is prepared, the mold 180 is pressed under a temperature condition (110° C.) that shows the minimum melting viscosity and pressure of 0.8 MPa for 3 minutes (Refer to FIG. 7(a)) on the lower insulating layer 132, and afterward, when it is cooled down to 70° C., the mold 80 rises to be removed from the lower insulating layer 132, and the lower insulating layer 32 is completely hardened by heating at 150° C. for 1 hour so that the concave portion for optical wiring 32a that has 45°-inclined surfaces at both ends is formed on the lower insulating layer 132 (Refer to FIG. 7(b)). Next, in the same manner as Embodiment 1-1, the metal reflective layer 38 is formed on the 45°-inclined surface, and the concave portion for optical wiring 32a is filled with core materials in excess to make the core material excess filler 76 (Refer to FIG. 7(c)). Next, the core material excess filler 76, which is raised, is ground to be planarized so that the upper surface of the lower insulating layer 132 and the upper surface of the core material are flat (Refer to FIG. 7(d)). Next, the via-hole 132c of 50 to 150 μm in diameter is formed on the lower insulating layer 132 using carbon dioxide gas laser of 10.6 μm in wavelength under the condition of pulse width of 10 to 25μ/second, a through-hole diameter of the mask of ø1.5 to 5.0 mm, and one to three shots. Next, a sputtered thin film made of Ti/Pt/Au is formed on the entire surface by sputtering in an argon atmosphere with output of 200 W for 30 minutes under 0.6 Pa of pressure. Next, an electroless plating film of 0.6 to 3.0 μm in thickness is formed on the entire surface by electroless copper plating using an electroless copper plating solution (copper sulfate: 0.03 mol/L; EDTA: 0.200 mol/L; HCHO: 0.18 g/L NaOH: 0.100 mol/L, α, α'-bipyridyl=100 mg/L, polyethyleneglycol: 0.10 g/L) at a solution temperature of 34° C. for 40 minutes. Next, plating resist is formed so as to expose the predetermined electrical wiring pattern by attaching a photosensitive dry film and using a mask to expose and develop, and the exposed part is electro copper plated using electro copper plating solution (sulfuric acid: 2.24 mol/L, copper sulfate=0.26 mol/L, additive (Product name: Kaparacid GL manufactured by Atotech Japan): 19.5 ml/L) under the conditions of current density at 1 A/dm², 90±5 hours and temperature of 22±2° C., so as to form an electro plating film of 20 μm in thickness. Afterward, the plating resist is peeled and removed using KOH of around 5%, and the electroless plating film and the sputtered thin film covered with the plating resist is etched using mixed liquid of sulfuric acid and hydrogen peroxide for removal by dissolving. This forms the conductor layer 140, which is convex, on the lower insulating layer 132 and also forms the via-hole conductor 144 that connects the conductor layer 140 to the conductor layer 12 (Refer to FIG. 7(e)). Afterward, in the same procedure as Embodiment 1-1, the optical/electrical composite wiring board 110 is obtained. Additionally, in Embodiment 9, although a sputtered thin film is formed before electroless copper plating, a roughening process may be conducted instead of forming the sputtered thin film.

Embodiment 10

Figure 8:
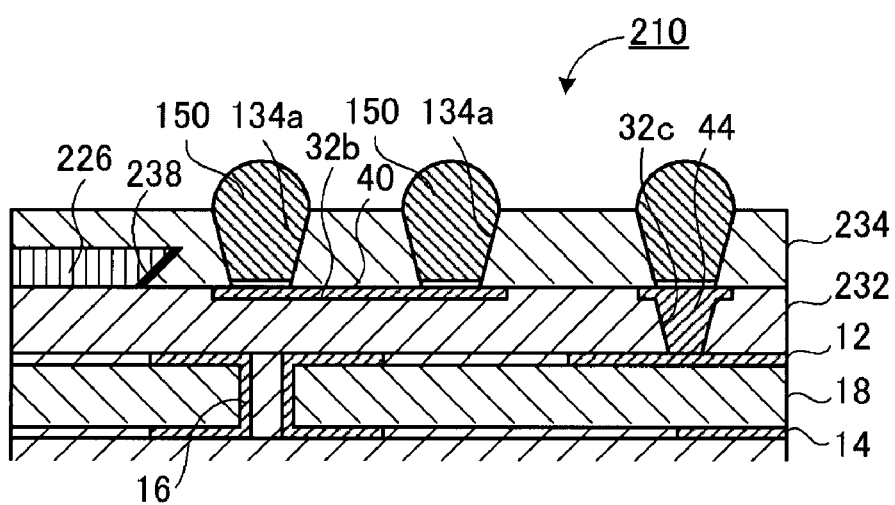
FIG. 8 is a cross-sectional view that shows an outline of the constitution of the optical/electrical composite wiring board 210.
Figure 9:
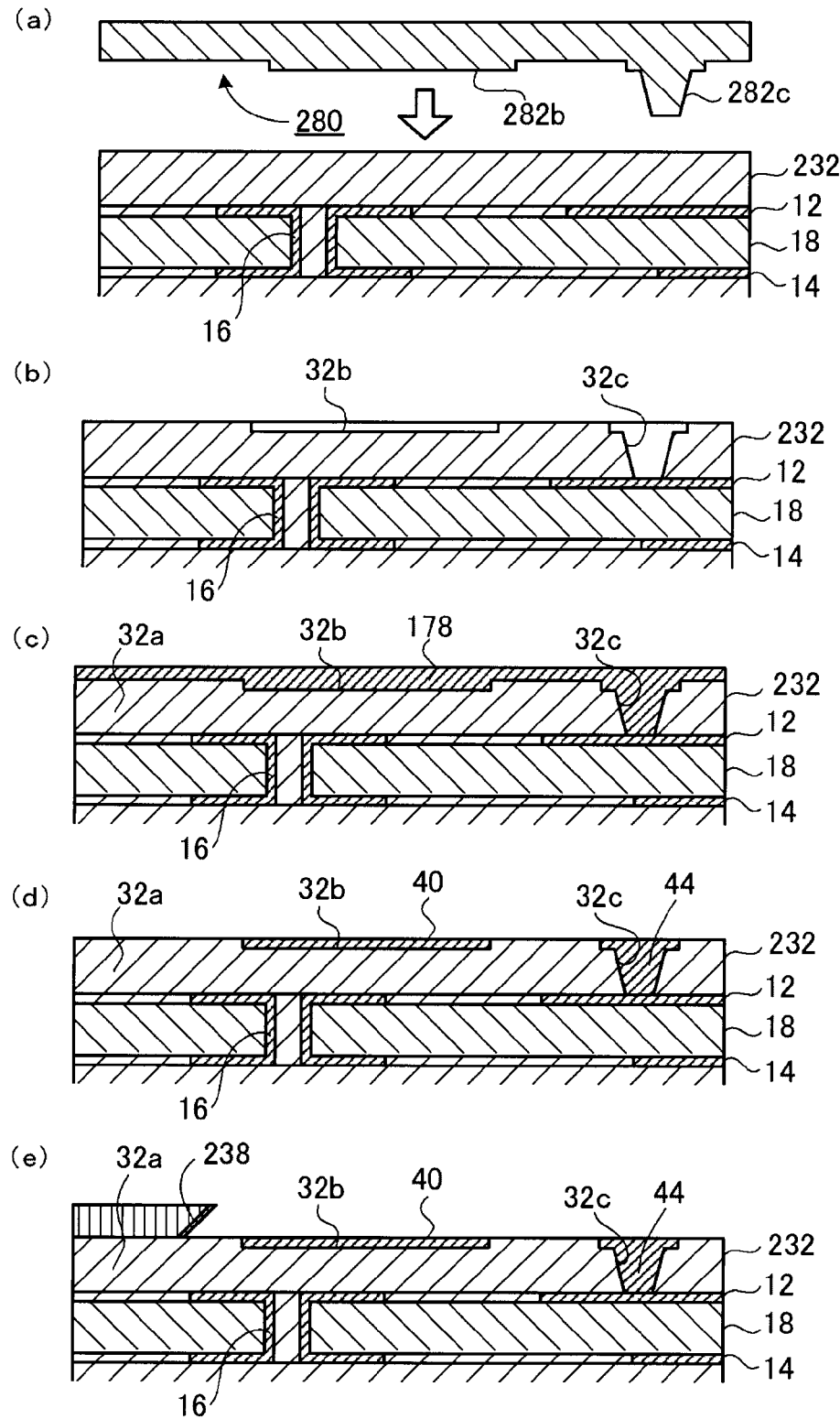
FIG. 9 is an explanatory drawing that shows a manufacturing step of the optical/electrical composite wiring board 210.

In Embodiment 10, the optical/electrical composite wiring board 210 shown in FIG. 8 is manufactured. The optical/electrical composite wiring board 210 comprises: the lower insulating layer 232 that also serves as the lower clad of the optical waveguide; the upper insulating layer 234 that also serves as the upper clad of the optical waveguide; the core 226 of the optical waveguide which is placed between the lower insulating layer 232 and the upper insulating layer 234 and has a predetermined optical wiring pattern; and the conductor layer 40 which is placed along with the core 226 between the lower insulating layer 232 and the upper insulating layer 234 and has a predetermined electrical wiring pattern, wherein the core 226 is formed into a convex shape on the lower insulating layer 232 and the conductor layer 40 is formed by filling the concave portion for electrical wiring 32b placed in the lower insulating layer 232 with conductor materials. Additionally, while the concave portion for electrical wiring 32b that has approximately the same pattern as the predetermined electrical wiring pattern and the via-hole 32c are formed by press working, the conductor layer 40 is formed using the concave portion for electrical wiring 32b, and the via-hole conductor 44 is formed using the via-hole 32c after the inter-layer insulating layer film in Embodiment 1-1 is attached on the conductor layer 12 placed on the surface of the substrate 18, the core 226 is formed using an exposure development method. This manufacturing method is explained in detail based on FIG. 9.

First, the mold 280 for press working, which comprises the convex portion for electrical wiring 282b and the convex portion for via-hole 282c for forming the concave portion for electrical wiring 32b and the via-hole 32c on the lower surface, is prepared, and the mold 280 is pressed on the lower insulating layer 232 under the temperature condition (110° C.) that shows the minimum melt viscosity with pressure of 0.8 MPa for 3 minutes (Refer to FIG. 9(a)), and afterward, when it is cooled down to 70° C., the mold 280 rises to be removed from the lower insulating layer 232 and the lower insulating layer 232 is hardened completely by heating at 150° C. for 1 hour so that the concave portion for electrical wiring 32b and the via-hole 32c are formed on the lower insulating layer 232 (Refer to FIG. 9(b)). Next, a sputtered thin film made of Ti/Cu is formed on the entire surface by sputtering with output: 200 W at 0.6 Pa for 30 minutes under argon atmosphere, and an electroless plating film of 0.6 to 3.0 μm in thickness is formed on the entire surface by electroless copper plating using electroless copper plating solution, which is similar to Embodiment 5, and furthermore, an electro plating film of 20 μm in thickness is formed by electro copper plating similarly to Embodiment 5. This makes the entire surface of the lower insulating layer 232 covered with the metal layer 178 and the concave portion for electrical wiring 32b and the via-hole 32c filled with the metal layer 178 (Refer to FIG. 9(c)). Afterward, the lower insulating layer 232 is ground to be planarized so as to make the upper surface of the lower insulating layer 232 and the upper surface of the metal layer 178 flat. This forms the conductor layer 40 that has a predetermined electrical wiring pattern and the via-hole conductor 44 on the lower insulating layer 232 (Refer to FIG. 9(d)). Next, the core 226 that has a 45°-inclined surface at both ends is formed by printing core materials on the entire surface using a squeegee and exposure-developing using a grating mask, and the metal reflective layer 238 is formed by inserting a 45°-mirror part into the 45°-inclined surface (Refer to FIG. 9(e), the figure shows the metal reflective layer 238 only). Afterward, the optical/electrical composite wiring board 210 is obtained in the same procedure as Embodiment 1-1. Additionally, in Embodiment 10, a sputtered thin film is formed before electroless copper plating, but a roughening process may be conducted instead of forming a sputtered thin film.

Embodiment 11

Optical wiring and electrical wiring are formed using a 4-inch wafer board as a supporting member instead of the substrate 18 in a similar way to Embodiment 1-1 so as to manufacture the optical/electrical composite wiring board 10 as an optical waveguide film (flexible substrate), and afterward, it is immersed in 2.5 wt % hydrofluoric acid solution for 1 hour and the optical/electrical composite wiring board 10 is peeled off the supporting member. As a method for peeling the optical waveguide film off the supporting member, in addition to a method for immersing in hydrofluoric acid solution, there are methods for coating remover solution such as silicon spray on the supporting member and coating resin to be peeled off when heated.

Other Embodiments

Film for inter-layer insulating layers include, for example, mixed resin of heat-hardening resin and thermoplastic resin, photosensitized heat-hardening resin, UV hardening resin, and so on, in addition to the heat-hardening resin described in Embodiment 1-1. Scale-like particles similar to those in Embodiment 1-1 are preferably added to these resins.

Herein, an example of manufacturing a film for an inter-layer insulating layer made of mixed resin of heat-hardening resin and thermoplastic resin is described below. In other words, after 120 parts by weight of mixture containing scale-like particles prepared in Embodiment 1-1, 65 parts by weight of Cresol novolac epoxy resin (manufactured by Nippon Kayaku Co., Ltd.; product name: EOCN-104S; epoxy equivalent: 220; molar weight: 5000), 40 parts by weight of polyether sulfone (manufactured by ICI; product name: Victrex; molar weight: 17,000), and 5 parts by weight of imidazole hardening agent (manufactured by Shikoku Chemicals Corporation; product name: 2E4MZ-CN) are mixed, N-methylpyrrolidone is added to adjust viscosity to 120 cps using a Homo Disper stirring machine so that a film precursor is manufactured. The film precursor is coated on a film of 50 μm in thickness made of polymethylpentene (manufactured by Mitsui Petrochemical Industries, Ltd.; product name: Opulen X-88; softening point: 180° C.) using a roll-coater (manufactured by Cermatronics Boeki Co., Ltd.), and afterward, it is dried to be hardened at 80° C. for 2 hours, at 120° C. for 5 hours, and at 150° C. for 2 hours to manufacture a film for an inter-layer insulating layer of 40 μm in thickness. The film has scale-like particle content of 20 wt % as solids.

An example for manufacturing a film for an inter-layer insulating layer made of photosensitized heat-hardening resin is described below. In other words, after 100 parts by weight of mixture containing scale-like particles prepared in the same manner as Embodiment 1-1, 56 parts by weight of 25% acrylic of Cresol novolac epoxy resin (manufactured by Nippon Kayaku Co., Ltd.; molar weight: 2500) dissolved in dimethyl glycol dimethyl ether, 2 parts by weight of imidazole hardening agent (manufactured by Shikoku Chemicals Corporation; product name: 2E4MZ-CN), 4 parts by weight of caprolactone modified tris (acryloyloxyethyl) isocyanurate (manufactured by Toagosei Co., Ltd.; product name: Aronix M315) which is photosensitive monomer, 2 parts by weight of photo initiator (manufactured by Ciba-Geigy K.K.; product name: Irgacure 907), and 0.2 parts by weight of photosensitizer (manufactured by Nippon Kayaku Co., Ltd., Product name: DETX-S) are mixed, 30.0 parts by weight of N-methylpyrrolidone are added and mixed to adjust viscosity to 7 Pa·s using a Homo Disper stirring machine, and next, it is mixed using three rollers to obtain a film precursor. The film precursor is coated on a film of 50 μm in thickness made of polymethylpentene (manufactured by Mitsui Petrochemical Industries, Ltd.; product name: Opulen X-88, softening point: 180° C.) using a roll-coater (manufactured by Cermatronics Boeki Co., Ltd.) and dried to be hardened at 80° C. for 2 hours, at 120° C. for 5 hours, and at 150° C. for 2 hours so as to manufacture a resin for an inter-layer insulating layer of 40 μm in thickness. The film has scale-like particle content of 57 wt % as solids. Moreover, transmissivity (850 nm) after hardening is 99%/mm. Since the resin for inter-layer insulating layer film is used as a clad, materials, of which a predetermined ratio of proton (-H) in epoxy resin is converted into fluorine (-F) or deuterium (-D) in advance, are used or materials, of which sulfur is added to the materials to adjust the refractive index between 1.4 and 1.6 (herein, adjusted to about 1.5), are used.

Furthermore, an example for manufacturing a resin for an inter-layer insulating layer made of UV hardening resin is described below. In other words, 100 parts by weight of a mixture containing scale-like particles prepared in the same manner as Embodiment 1-1, 40 parts by weight of acrylic resin, 10 parts by weight of acrylate monomer, 4 parts by weight of imidazole hardening agent as hardening agent, 5 parts by weight of benzophenone as photopolymerization initiator, 40 parts by weight of ethyl lactate as solvent, and 1 parts by weight of stabilizer are mixed so as to manufacture a resin for an inter-layer insulating layer with viscosity of 5±1 Pa·s under revolution of 5 rpm at 25° C. The resin for an inter-layer insulating layer has scale-like particle content of 21 wt % as solids. If C—H in one part of the resin for inter-layer insulating layer is fluorinated (C—F), the refractive index becomes as small as 1.54, so it can be used for lower insulating layers and upper insulating layers that also serve as a clad, and if one part of C—H is deuterated (C-D), the refractive index becomes as high as 1.56, so it can be used for core materials. Moreover, transmissivity after hardening (850 nm) is 90%/mm. Or, in order to use the resin for an inter-layer insulating layer as a clad, materials, of which a predetermined ratio of proton (—H) in epoxy resin is converted into fluorine (—F) or deuterium (-D) in advance, or materials, of which a predetermined ratio of sulfur is added to the materials so as to adjust the refractive index between 1.4 and 1.6 (herein, adjusted to about 1.5), can be used. For example, 100 parts by weight of mixture containing scale-like particles prepared in the same manner as Embodiment 1-1, 95 parts by weight of fluorinated epoxy resin, 2 parts by weight of photopolymerization initiator, and 3 parts by weight of stabilizer (solventless) may be mixed so as to manufacture a resin for an inter-layer insulating layer with viscosity of 4.3 Pa·s at 25° C. The viscosity was measured using Rotary B viscosity meter DVM-BII (Rotor No. 4, revolution: 60 rpm) manufactured by Toki Sangyo Co., Ltd. The resin has scale-like particle content of 21 wt % as solids. Transmissivity after hardening (850 nm) is 99%/mm.

Next, evaluation test results of each embodiment are explained.

Shape Stability and Optical/Electrical Property

Figure 10:
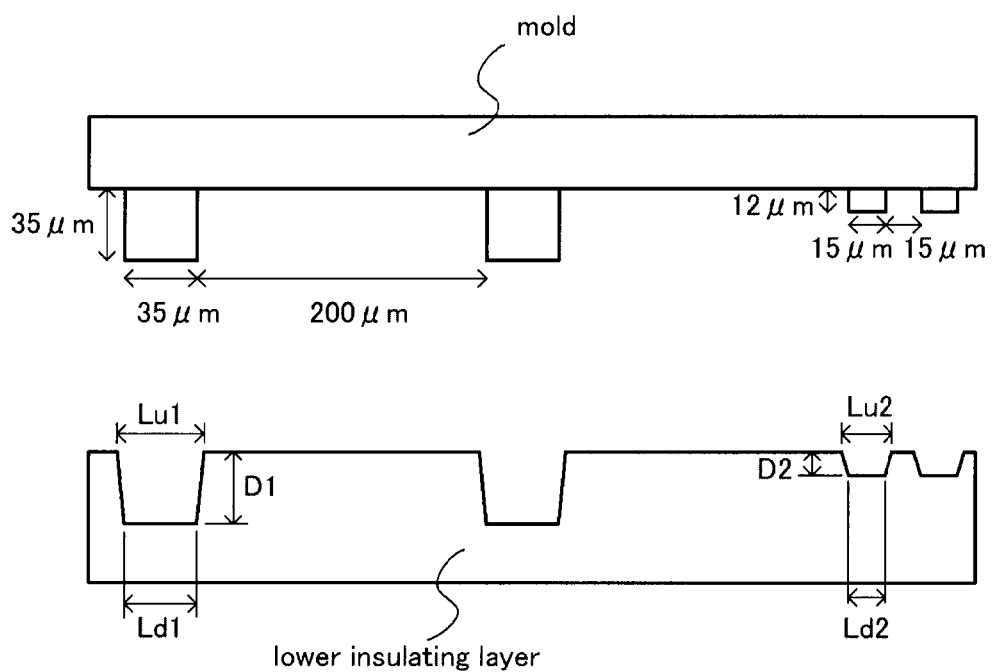
FIG. 10 is an explanatory drawing that shows an outline of the mold used in the embodiment and the lower insulating layer manufactured in the embodiment.

After manufacturing the optical/electrical composite wiring boards in Embodiments 1-1, 2 to 5, and 8 to 11 using a mold of the size shown in FIG. 10, each of the distances Lu1, Ld1, D1, Lu2, Ld2, and D2, shown in FIG. 10, were measured by magnifying the cross-sectional shape to 1000 times using a length measuring microscope (graduated microscope). Additionally, optical propagation loss was calculated by measuring loss of sample cut into 2 cm, 4 cm, 6 cm, and 8 cm with cutback method, and characteristic impedance was measured with a design value of 50 Ω using TDR (Time Domain Reflectometer) manufactured by Agilent Technologies, Inc. The result is shown in Table 1. As seen clearly in Table 1, if the core of the optical waveguide is formed by filling core materials in the concave portion for optical wiring of the lower insulating layer containing scale-like particles, the core has good shape stability and also reduced optical propagation loss (Embodiments 1-1, 2 to 4, and 9). Moreover, if the conductor layer (conductor layer placed along with the core) is formed by filling conductor material in the concave portion for electrical wiring of the lower insulating layer containing scale-like particles, the conductor layer has good shape stability and also has almost the same characteristic impedance as the design value (Embodiments 1-1, 2 to 4, 10, and 11). Additionally, even if scale-like particles were added when manufacturing the film for inter-layer insulating layer, particles were not agglutinated (Embodiments 1-1, 2 to 4, 9, 10, and 11), but when spherical shape particles are added, tendency was found that particles are aggregated (Embodiments 8-1 and 8-2). Furthermore, although resin dripping in the concave portion for optical wiring was not found due to dimensional constraint effect (Embodiments 1-1, 2 to 4, 6, 7, and 9) when scale-like particles were added, when scale-like particles were not added or spherical shape particles were added instead of scale-like particles, dimensional constraint effect was not found and resin dripping in the concave portion for optical wiring was found (Embodiments 5, 8-1, and 8-2). With regard to the optical/electrical composite wiring boards in each embodiment shown in Table 1, dimensional accuracy of the optical wiring was improved and optical transmission loss was reduced, and dimensional accuracy of the electrical wiring was improved and characteristic impedance was improved. From the above, it can be said that the optical/electrical composite wiring boards in each embodiment are favorable for high-speed transmission.

Moreover, since Embodiments 3 and 4 showed slightly bad optical propagation loss compared to Embodiments 1-1 and 2, the bottom surface and wall surfaces of the concave portion for optical wiring 32a (Refer to FIG. 1) were observed using a microscope in order to examine the cause, and it was confirmed that there was a bigger convex portion than the transmission wavelength in Embodiments 3 and 4. Although the cause is unknown, the following is deduced. Scale-like particles are added to the lower insulating layer 32 (Refer to FIG. 1), which is to be a lower clad, and when the lower insulating layer 32 is hardened, and the scale-like particles are moved. Scale-like particles are projected from the bottom surface and wall surface of the concave portion for optical wiring 32a, which results in a convex portion, and the convex portion comes into the core. It is deduced that, if the size of the scale-like particles is bigger than the transmission wavelength (850 nm) as seen in Embodiments 3 and 4, the convex portion coming into the core makes optical propagation loss high, but if the size of the scale-like particles is smaller than the transmission wavelength as seen in Embodiments 1-1 and 2, optical propagation loss does not become high even if the convex portion coming into the core exists. Therefore, since smaller optical propagation loss is preferred to transmit a long distance, the scale-like particles with the size of smaller than the transmission wavelength are preferably used.

TABLE 1

| Embodiment | Particles formation | Aspect ratio | D1 (μm) | Lu1-Ld1 (μm) | Optical propagation loss (dB/cm) | D2 (μm) | Lug-Ld2 (μm) | Characteristic impedance (Ω) |
|---|---|---|---|---|---|---|---|---|
| Embodiment 1-1 | Scale shape | 100-500 | 34.8 | 0.9 | 0.28 | 12.1 | 0.5 | 52 |
| Embodiment 1-2 | Scale shape | 100-500 | 34.8 | 0.9 | 0.31 | 12.1 | 0.5 | — |
| Embodiment 1-3 | Scale shape | 100-500 | 34.8 | 0.9 | 0.29 | 12.1 | 0.5 | — |
| Embodiment 1-4 | Scale shape | 100-500 | 34.8 | 0.9 | 1.21 | 12.1 | 0.5 | — |
| Embodiment 2 | Scale shape | 100-500 | 35.3 | 0.8 | 0.29 | 12.3 | 0.4 | 51 |
| Embodiment 3 | Scale shape | 20-30 | 35.2 | 0.6 | 0.45 | 12.4 | 0.5 | 51 |
| Embodiment 4 | Scale shape | 100-2,000 | 34.9 | 0.9 | 0.49 | 12.2 | 0.3 | 52 |
| Embodiment 5 | (not added) | — | 35.4 | 4.3 | 0.25 | 12.1 | 1.8 | 60 |
| Embodiment 6 | Scale shape | 7-10 | 35.0 | 3.5 | 0.32 | 12.2 | 1.4 | 59 |
| Embodiment 7 | Scale shape | 5,000-7,000 | 35.2 | 2.9 | 0.69 | 12.2 | 1.5 | 60 |
| Embodiment 8-1 | Spherical shape | 1 | 34.8 | 3.3 | 0.71 | 12.2 | 1.9 | 61 |
| Embodiment 8-2 | Spherical shape | 1 | 34.7 | 3.7 | 0.56 | 12.3 | 1.8 | 61 |
| Embodiment 9 | Scale shape *[1] | 100-500 | 35.1 | 0.8 | 0.30 | 12.4 | 1.8 | 60 |
| embodiment 10 | Scale shape *[2] | 100-500 | 34.7 | 4.4 | 0.32 | 12.2 | 0.6 | 53 |
| Embodiment 11 | Scale shape | 100-500 | 34.7 | 0.8 | 0.29 | 12.2 | 0.5 | 51 |

*[1] The core is formed in the concave portion for optical wiring of the lower insulating layer and the conductor layer is formed into a convex shape on the lower insulating layer.
*[2] The conductor layer is formed in the concave portion for electrical wiring of the lower insulating layer, and the core is formed into a convex shape on the lower insulating layer.

Impact Resistance

After the optical/electrical composite wiring boards in Embodiments 1-1 to 1-4, 2 to 7, and 11 were manufactured using a mold of the size shown in FIG. 10, the coefficient of thermal expansion $\alpha 1$ of the upper and lower insulating layers that also serve as the clad of the optical waveguide was measured using a thermal mechanical analyzer (TMA, Product name: TMA/SDTA840 manufactured by Mettler-Toledo International Inc.). Moreover, after these optical/electrical composite wiring boards were put into a heat cycle testing machine (product name: Thermal Shock Chamber; manufactured by ESPEC) for impact resistance testing under the following Condition 1 and Condition 2, cracks that occurred in the core or clad of the optical waveguide were checked. The results are shown in Table 2. As seen clearly in Table 2, by adding scale-like particles to the upper and lower insulating layers, it was found that good impact resistance was obtained. Particularly, if $\alpha 1$ is 40 to 60 [$\times 10^{-6}$/° C.], good impact resistance was obtained even after testing under Condition 2. Herein, with regard to Embodiments 1-1 to 1-3, good results for both values of impact resistance and optical propagation loss were obtained. On the other hand, with regard to Embodiment 1-4, impact resistance was good, but optical propagation loss was high with 1.21 dB/cm. It is believed that this is because scale-like particle content was large and aggregation of the scale-like particles had occurred.

Condition 1: Repeat 1 cycle with −55° C.×5 minutes and 125° C.×5 minutes 1,000 times
Condition 2: Repeat 1 cycle with 25° C.×20 seconds and 260° C.×10 seconds 100 times

TABLE 2

| Embodiment | Aspect ratio of the scale-like particles | Coefficient of thermal expansion of the upper and lower insulating layer ($\times 10^{-6}$/° C.) $\alpha 1$ | Condition 1 Core or clad | Condition 2 Core or clad |
|---|---|---|---|---|
| Embodiment 1-1 | 100-500 | 43 | ○ | ○ |
| Embodiment 1-2 | 100-500 | 72 | ○ | x |
| Embodiment 1-3 | 20-30 | 60 | ○ | ○ |
| Embodiment 1-4 | 100-2000 | 38 | ○ | ○ |
| Embodiment 2 | 100-500 | 48 | ○ | ○ |
| Embodiment 3 | 20-30 | 49 | ○ | ○ |
| Embodiment 4 | 100-2000 | 52 | ○ | ○ |
| Embodiment 5 | (not added) | 80 | x | x |
| Embodiment 6 | 7-10 | 64 | ○ | x |
| Embodiment 7 | 5,000-7,000 | 66 | ○ | x |
| Embodiment 11 | 100-500 | 43 | ○ | ○ |

Connection Resistance Evaluation for the Via-Hole

After the optical/electrical composite wiring boards in Embodiments 1-1, 2 to 4, 6, and 7 were manufactured using a mold of the size shown in FIG. 10, they were put into a heat cycle test machine (mentioned above) for impact resistance testing under Condition 1, 2 (mentioned above) and the amount of change of connection resistance before and after testing was measured and evaluated. With regard to the amount of change of connection resistance, initial resistance value and resistance value after the heat cycle on a via-hole link pattern for connection resistance evaluation were measured, and the amount of change (=resistance value after heat cycle/initial resistance value) within ±5% is shown as ○, over −5% within −10% or over +5% within +10% is shown as Δ, and others are shown as x. Furthermore, via-holes of ø40 μm, ø50 μm, ø60 μm, and ø70 μm were manufactured to measure each amount of change of connection resistance. The results are shown in Table 3. As seen clearly in Table 3, when the aspect ratio is 20 to 2000, connection resistance is stable with via-holes of ø60 μm and ø70 μm (Embodiments 1-1, 2 to 4).

Particularly, when the aspect ratio is 20 to 500, connection resistance is stable with all via-holes of ø40 to 70 μm (Embodiments 1-1, 2, and 3).

TABLE 3

| Embodiment | Aspect ratio of the scale-like particles | ø40 (μm) Condition 1 | ø40 (μm) Condition 2 | ø50 (μm) Condition 1 | ø50 (μm) Condition 2 | ø60 (μm) Condition 1 | ø60 (μm) Condition 2 | ø70 (μm) Condition 1 | ø70 (μm) Condition 2 |
|---|---|---|---|---|---|---|---|---|---|
| Embodiment 1-1 | 100-500 | ○ | ○ | ○ | ○ | ○ | ○ | ○ | ○ |
| Embodiment 2 | 100-500 | ○ | ○ | ○ | ○ | ○ | ○ | ○ | ○ |
| Embodiment 3 | 20-30 | ○ | ○ | ○ | ○ | ○ | ○ | ○ | ○ |
| Embodiment 4 | 100-2000 | x | x | ○ | x | ○ | ○ | ○ | ○ |
| Embodiment 5 | (not added) | x | x | x | x | x | x | x | x |
| Embodiment 6 | 7-10 | x | x | x | x | ○ | x | ○ | ○ |
| Embodiment 7 | 5000-7000 | x | x | x | x | ○ | x | ○ | ○ |
| Embodiment 11 | 100-500 | ○ | ○ | ○ | ○ | ○ | ○ | ○ | ○ |

The present invention can be used for circuit substrates such as circuit substrates for mounting photonic devices.

What is claimed is:

1. An optical/electrical composite wiring board comprising:
   a lower insulating layer having a concave portion having a predetermined optical wiring pattern for a core portion of an optical waveguide and a concave portion having an electrical wiring pattern;
   a core comprising a core material filled in the concave portion of the predetermined optical wiring pattern such that the core portion of the optical waveguide is formed in the lower insulating layer;
   a conductor layer comprising a conductive material filled in the concave portion of the electrical wiring pattern such that the conductor layer is formed in the lower insulating layer; and
   an upper insulating layer formed over the core and the conductor layer and having an upper clad portion for the optical waveguide,
   wherein the lower insulating layer has a lower clad portion of the optical waveguide formed by the predetermined optical wiring pattern.

2. The wiring board according to claim 1, wherein said concave portion for the conductor layer has an inner surface, at least a portion of which includes a roughened surface.

3. The wiring board according to claim 1, wherein said core comprises a reflective surface at opposing ends of the core, each reflective surface being formed at an angle of about 45° relative to a center axis of the core, and said upper insulating layer forms an outermost layer of the optical/electrical composite wiring board.

4. The wiring board according to claim 1, wherein said lower insulating layer includes a plurality of particles which has a scale shape.

5. The wiring board according to claim 4, further comprising:
   a lower conductor layer provided on said lower insulating layer on an opposite side of the conductor layer; and
   a via-hole formed in said lower insulating layer and connecting the conductor layer with the lower conductor layer.

6. The wiring board according to claim 4, wherein said particles have an aspect ratio of 20 to 2000.

7. The wiring board according to claim 4, wherein said particles have an average length and an average thickness less than a wavelength of light passing through said core.

8. The wiring board according to claim 1, wherein each of said lower insulating layer and said upper insulating layer includes a plurality of particles which has a scale shape and has a coefficient of thermal expansion α1 of 40 to 60 [=$10^{-6}$/°C].

9. The wiring board according to claim 1, wherein the upper insulating layer, the core, the conductor layer and the lower insulating layer form an optical waveguide film.

* * * * *